(12) United States Patent
Amo

(10) Patent No.: US 9,748,407 B2
(45) Date of Patent: Aug. 29, 2017

(54) SEMICONDUCTOR DEVICE AND METHOD OF MANUFACTURING SAME

(71) Applicant: Renesas Electronics Corporation, Koutou-ku, Tokyo (JP)

(72) Inventor: Atsushi Amo, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/043,569

(22) Filed: Feb. 14, 2016

(65) Prior Publication Data

US 2016/0293776 A1 Oct. 6, 2016

(30) Foreign Application Priority Data

Mar. 30, 2015 (JP) ................. 2015-070423

(51) Int. Cl.
| | | |
|---|---|---|
| H01L 21/28 | (2006.01) | |
| H01L 29/792 | (2006.01) | |
| H01L 29/66 | (2006.01) | |
| H01L 29/78 | (2006.01) | |
| H01L 29/423 | (2006.01) | |
| H01L 27/1157 | (2017.01) | |

(52) U.S. Cl.
CPC ...... *H01L 29/792* (2013.01); *H01L 21/28282* (2013.01); *H01L 27/1157* (2013.01); *H01L 29/42344* (2013.01); *H01L 29/66484* (2013.01); *H01L 29/66833* (2013.01); *H01L 29/7831* (2013.01)

(58) Field of Classification Search
CPC ......... H01L 21/28282; H01L 27/11573; H01L 29/66545; H01L 29/42344; H01L 29/66833; H01L 29/792; H01L 27/11568
See application file for complete search history.

(56) References Cited

U.S. PATENT DOCUMENTS

| | | | |
|---|---|---|---|
| 7,915,666 B2 | 3/2011 | Yasui et al. | |
| 8,278,169 B2 | 10/2012 | Toba et al. | |
| 2010/0025753 A1* | 2/2010 | Terai | H01L 21/28282 257/324 |

FOREIGN PATENT DOCUMENTS

| | | |
|---|---|---|
| JP | 2006-332143 A | 12/2006 |
| JP | 2008-288503 A | 11/2008 |
| JP | 2009-010104 A | 1/2009 |

\* cited by examiner

*Primary Examiner* — David Vu

(74) *Attorney, Agent, or Firm* — Shapiro, Gabor and Rosenberger, PLLC

(57) ABSTRACT

An object is to provide a reliability-improved semiconductor device having a MONOS memory that rewrites data by injecting carriers into a charge storage portion. When a memory gate electrode having a small gate length is formed in order to overlap a carrier injection position in write operation with that in erase operation, each into an ONO film including a charge storage portion, the ONO film is formed in a recess of a main surface of a semiconductor substrate for securing a large channel length. In a step of manufacturing this structure, control gate electrodes are formed by stepwise processing of a polysilicon film by first and second etching and then, the recess is formed in the main surface of the semiconductor substrate on one side of the control gate electrode by second etching.

19 Claims, 18 Drawing Sheets

FIG. 26

| | OPERATION METHOD WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|---|
| A | SSI (WRITE)/BTBT (ERASE) | 12/6/1.5/1/0 | -6/7/0/0/0 | 0/0/1.5/1.5/0 |
| B | SSI (WRITE)/FN (ERASE) | 12/6/1.5/1/0 | 12/0/0/0/0 | 0/0/1.5/1.5/0 |

SEMICONDUCTOR DEVICE AND METHOD OF MANUFACTURING SAME

CROSS-REFERENCE TO RELATED APPLICATIONS

The disclosure of Japanese Patent Application No. 2015-070423 filed on Mar. 30, 2015 including the specification, drawings, and abstract is incorporated herein by reference in its entirety.

BACKGROUND

The present invention relates to a semiconductor device and a method of manufacturing it, for example, those applicable to manufacture of a semiconductor device having a nonvolatile memory.

As an electrically writable/erasable nonvolatile semiconductor memory device, an EEPROM (electrically erasable and programmable read only memory) has been used widely. Such a memory device has, below the gate electrode of a MISFET, a conductive floating gate electrode or a trapping insulating film surrounded by an oxide film. A charge storage state in the floating gate electrode or trapping insulating film (charge retention portion) is used as stored data and read out as the threshold value of the transistor.

The trapping insulating is an insulating film capable of storing charges therein, and a silicon nitride film is one example of it. By injection/release of charges into/from such a charge storage region, the threshold value of the MISFET is shifted to allow the MISFET to operate as a memory element. Examples of a nonvolatile semiconductor memory device using this trapping insulating film include a split-gate cell using a MONOS (metal oxide nitride oxide semiconductor) film.

Patent Document 1 (Japanese Unexamined Patent Application Publication No. 2006-332143) describes a split gate type MONOS memory whose memory gate electrode is formed on a surface which is a main surface of a semiconductor substrate and at the same time, is a second surface lower than a first surface of the semiconductor substrate right below a control gate electrode.

Patent Document 2 (Japanese Unexamined Patent Application Publication No. 2008-288503) describes a split-gate type MONOS memory which performs an erase operation using FN tunneling.

Patent Document 3 (Japanese Unexamined Patent Application Publication No. 2009-010104) describes forming both a data memory cell and a code memory cell on a semiconductor substrate.

PATENT DOCUMENTS

[Patent Document 1] Japanese Unexamined Patent Application Publication No. 2006-332143
[Patent Document 2] Japanese Unexamined Patent Application Publication No. 2008-288503
[Patent Document 3] Japanese Unexamined Patent Application Publication No. 2009-010104

SUMMARY

In a trapping insulating film of a memory cell of a split gate type MONOS memory, a region into which charges are injected by a write operation sometimes does not overlap with a region from which charges are released by erase operation. In this case, the problem of deterioration in data rewrite efficiency and data retention characteristics occurs.

As a structure capable of overcoming the above-described problem while preventing deterioration in punch-through characteristic, there is known a structure, as described in Patent Document 1, in which a trapping insulating film and a memory gate electrode are formed in a region of the main surface of a semiconductor substrate deeper than a control gate electrode.

Such a structure is presumed to be formed by a step of etching a polysilicon film on a semiconductor substrate once using photolithography to form a control gate electrode and then lowering the main surface level of the semiconductor substrate in one of regions on the side of the control gate electrode by etching while covering the other region with a photoresist film. For lowering the main surface level of the semiconductor substrate in one of the regions on the side of the control gate electrode, it is necessary to stop formation of the photoresist film at a position right above the control gate electrode.

In recent years, however, the gate length of a control gate electrode has become smaller with miniaturization of semiconductor devices and it becomes difficult to stop formation of the photoresist film at a position right above the control gate electrode. This problem results in an increase in a proportion of defective semiconductor devices thus manufactured and the semiconductor devices therefore have deteriorated reliability.

Another object and novel features will be apparent from the description herein and accompanying drawings.

Of the embodiments disclosed herein, a typical one will next be outlined simply.

A method of manufacturing a semiconductor device according to one embodiment includes, in forming a split gate type MONOS memory, forming a control gate electrode by stepwise processing of a polysilicon film by first and second etching, forming a recess in the main surface of a semiconductor substrate on one side of the control gate electrode by second etching, and then filling the recess with an insulating film including a charge retention portion.

According to the embodiment, a semiconductor device having improved reliability can be provided.

BRIEF DESCRIPTION OF THE DRAWINGS

FIG. 26 is a table showing one example of voltage application conditions to each site of a selected memory cell at the time of "write", "erase", and "read-out".

DETAILED DESCRIPTION

Figure 1:
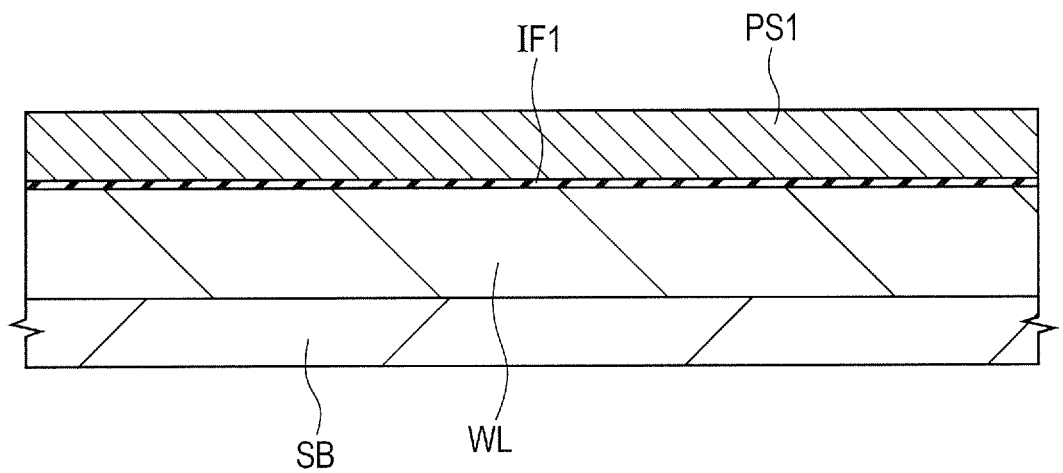
FIG. 1 is a cross-sectional view of a semiconductor device of First Embodiment during a manufacturing step thereof.

Embodiments will hereinafter be described in detail based on drawings. In all the drawings for describing the embodiments, members having the same function will be identified by the same reference numerals and overlapping descriptions will be omitted. In the following embodiments, repetition of the description on the same or similar portions will be omitted in principle unless otherwise particularly necessary.

First Embodiment

Semiconductor devices of the following embodiments including the present embodiment are equipped with a nonvolatile memory (nonvolatile memory element, flash memory, or nonvolatile semiconductor memory device). The nonvolatile memory described herein is a split gate type MONOS memory (which will hereinafter be called "MONOS memory" simply). With regard to the nonvolatile memory in the following embodiments including the present embodiment, a memory cell based on an n channel MISFET (MISFET: metal insulator semiconductor field effect transistor) will be described.

The polarity (the polarity of a voltage applied during writing, erasing, or reading and the polarity of carriers) in the following embodiments including the present embodiment is for describing the operation of a memory cell based on an n channel MISFET. When a memory cell based on a p channel MISFET is used, a similar operation can be performed in principle by reversing all the polarities of applied potentials, conductivity types of carriers, and the like.

<Method of Manufacturing Semiconductor Device>

A method of manufacturing a semiconductor device according to the present embodiment will be described referring to FIGS. 1 to 12.

FIGS. 1 to 3 and FIGS. 5 to 12 are each a cross-sectional view of the semiconductor device of the present embodiment during manufacturing steps thereof. FIG. 4 is a plan view of the semiconductor device of the present embodiment during a manufacturing step thereof.

Here, formation of n channel MISFETs (control transistor and memory transistor) is described, but alternatively, p channel MISFETs (control transistor and memory transistor) may be formed by reversing the conductivity type.

In the manufacturing steps of the semiconductor device, first, a semiconductor substrate (semiconductor wafer) SB made of, for example, p type single crystal silicon (Si) having a specific resistance of from about 1 to 10 Ωcm is provided. A trench is then formed in the main surface of the semiconductor substrate SB and an element isolation region (not shown) is formed in the trench. The element isolation region is made of, for example, a silicon oxide film and can be formed by STI (shallow trench isolation). The element isolation region may also be formed, for example, by LOCOS (local oxidization of silicon).

The region shown in FIG. 1 is a region where a memory cell will be formed later. Simultaneously with the formation of the element isolation region, an alignment mark (not shown) having a structure similar to that of the element isolation region EI is formed in a region other than the memory cell formation region.

Ion implantation into the main surface of the semiconductor substrate SB is then performed to form a p well WL in the main surface of the semiconductor substrate SB. The well WL is formed by implanting a p type impurity (for example, B (boron)) at a relatively low concentration. The well WL extends from the main surface of the semiconductor substrate SB to the middle of the depth of the semiconductor substrate SB. The semiconductor substrate SB is then heat treated to diffuse the impurity present in the well WL. Although neither illustrated nor described in detail here, in a region where a p type field effect transistor or a memory cell including it is formed, an n well is formed by the ion implantation of an n type impurity (for example, As (arsenic) or P (phosphorus)) into the main surface of the semiconductor substrate SB.

Thermal oxidation or the like is then performed to form an insulating film IF1 having a relatively small film thickness on an exposed upper surface of the semiconductor substrate SB. The upper surface of the semiconductor substrate SB is thus covered with the insulating film IF1. The insulating film IF1 is made of, for example, a silicon oxide film. A polysilicon film PS1 is then formed on the entire main surface of the semiconductor substrate SB using, for example, CVD (chemical vapor deposition). As a result, the polysilicon film PS1 is formed on the semiconductor substrate SB via the insulating film IF1. The polysilicon film PS1 is a conductor film for forming a control gate electrode CG described later.

With regard to the polysilicon film PS1, an amorphous silicon film is formed first and then, heat treatment is performed to convert the amorphous silicon film into the polysilicon film PS1 made of a polycrystalline silicon film. The polysilicon film PS1 can also be obtained by a low-resistance conductor film by not introducing an impurity during film formation but carrying out ion implantation of an n type impurity (for example, As (arsenic) or P (phosphorus)) after film formation and then heat treating the resulting film to diffuse the impurity.

Figure 2:
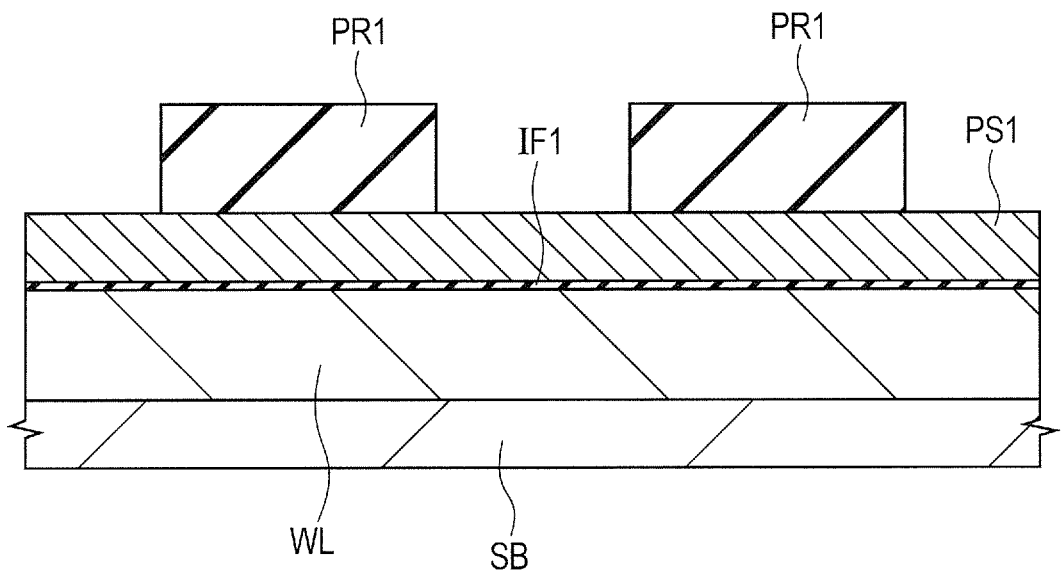
FIG. 2 is a cross-sectional view of the semiconductor device during a manufacturing step thereof following that of FIG. 1.

Next, as shown in FIG. 2, a plurality of photoresist films PR1 are formed on the polysilicon film PS1 by photolithography while separating them from each other. The upper surface of the polysilicon film PS1 is exposed between the photoresist films PR1 adjacent to each other. A region where the polysilicon film PS1 is exposed between the photoresist films PR1 adjacent to each other, that is, a region where the photoresist films PR1 has an opening is a region which is in the main surface of the semiconductor substrate SB and in which the drain region of a memory cell is to be formed in a later step. Alignment of a photomask to be used for exposure of a resist pattern comprised of the photoresist film PR1 is performed with the above-described alignment mark as a guide.

Figure 5:
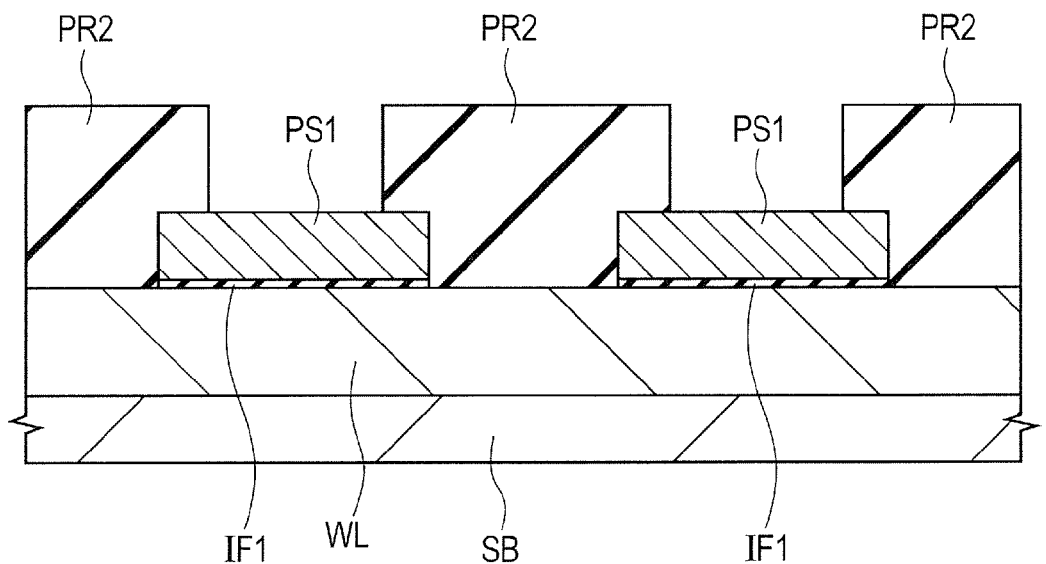
FIG. 5 is a cross-sectional view of the semiconductor device during a manufacturing step thereof following that of FIG. 3.

In addition, a photoresist film (not shown) for the formation of an alignment mark to be used for alignment of a mask for exposure in a photolithography step which will be described later referring to FIG. 5 is also formed in a region different from the formation region of a memory cell in a later step.

Figure 3:
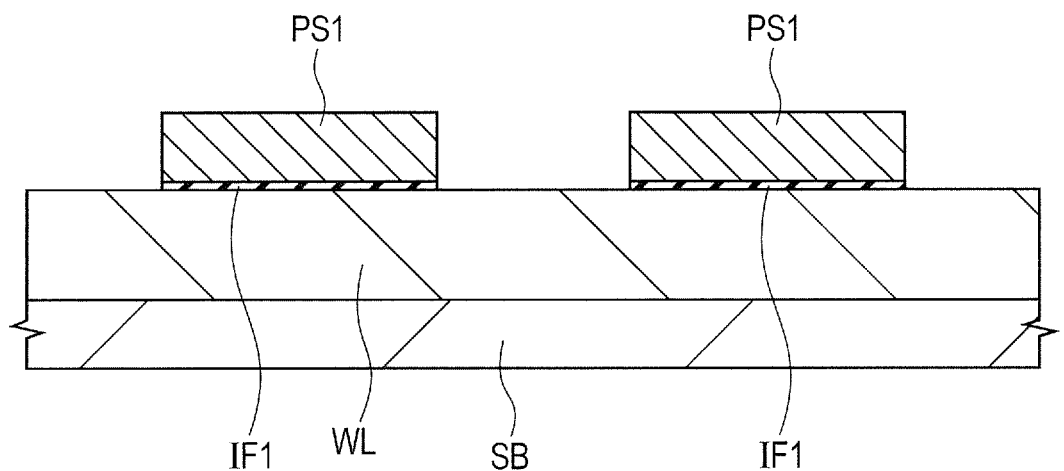
FIG. 3 is a cross-sectional view of the semiconductor device during a manufacturing step thereof following that of FIG. 2.
Figure 4:
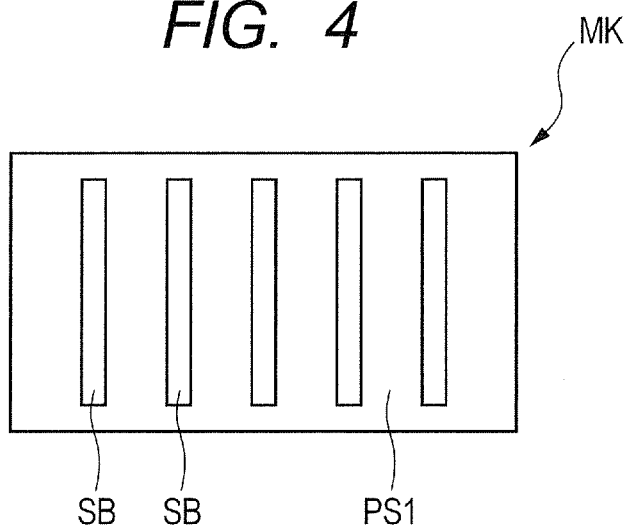
FIG. 4 is a plan view of the semiconductor device during a manufacturing step thereof following that of FIG. 2.

Next, as shown in FIG. 3, dry etching (anisotropic etching) is performed with the photoresist films PR1 as a mask to remove a portion of the polysilicon film PS1 and a portion of the insulating film IF1. This etching is terminated at the time when the etching reaches the insulating film IF1. A portion of the insulating film IF1 remains on the semiconductor substrate SB, but the insulating film IF1 exposed from the polysilicon film PS1 is removed by wet etching in a washing step performed later. Here, further etching for lowering the main surface level of the semiconductor substrate SB is not performed. The photoresist films PR1 are thereafter removed.

The polysilicon film PS1 and the insulating film IF1 are thus processed to expose a portion of the main surface of the semiconductor substrate SB. The polysilicon film PS1 is divided into a plurality of patterns arranged in a first direction, that is, a direction along the main surface of the semiconductor substrate. The plural polysilicon films PS1 thus processed each extend in a direction along the main surface of the semiconductor substrate, that is, a second direction orthogonal to the first direction, that is, a depth direction of FIG. 3.

As shown in FIG. 4, in this etching step, an alignment mark MK is formed by removing a portion of the polysilicon film PS1 in a region different from the memory cell formation region. The alignment mark MK has a pattern made of trenches, that is, regions from which the polysilicon film PS1 is removed. This pattern has a stripe-like structure in which longitudinal trenches are arranged in stripe form in plan view. This alignment mark MK is a pattern to be used for aligning, in a step which will be described later referring to FIG. 5, the photomask with the processing position of the polysilicon film PS1 described referring to FIG. 3 when exposure is performed using lithography. Although not shown here, a mark for examining whether or not the alignment is achieved normally is formed simultaneously.

The alignment mark MK is formed in a rectangular pattern of the polysilicon film PS1 in plan view and has a plurality of striped patterns. The striped patterns have, at the bottom thereof, an exposed main surface of the semiconductor substrate SB. According to the layout shown in this drawing, a plurality of patterns extending in a second direction in plan view are arranged in a first direction orthogonal to the second direction, but a layout in which a plurality of patterns extending in the first direction arranged in the second direction also become necessary.

Next, as shown in FIG. 5, a resist pattern comprised of a photoresist film PR2 is formed on the semiconductor substrate SB and the polysilicon film PS1 by photolithography. For forming the resist pattern, first a photoresist film PR2 is applied onto the entire main surface of the semiconductor substrate SB. Pattern transfer is performed by exposing the photoresist film PR2 through a photomask, followed by development to form a resist pattern of the photoresist film PR2.

The alignment mark MK (refer to FIG. 4) is used for alignment of the photomask in a lithography step. In the lithography step, by using an optical device installed on an exposure apparatus in which the photomask and the semiconductor substrate SB have been placed, the pattern of the alignment mark MK is detected and the alignment mark MK and the photomask are aligned.

Not an alignment mark formed in the step of forming the element isolation region but the alignment mark MK formed in the step of processing the polysilicon film PS1 first (refer to FIG. 3) is used in alignment of the photomask in order to prevent a difference in gate length between a pair of control gate electrodes which will be described later in the modification example of the present embodiment. Alignment between the alignment mark MK and the photomask with precision enables a resist pattern of the photoresist film PR2 to terminate at a desired position relative to the side wall of a stacked film comprised of the insulating film IF1 and the polysilicon film PS1.

The photoresist film PR2 has a pattern that covers the main surface of the semiconductor substrate in a region between the polysilicon films PS1 adjacent to each other in the first direction and a portion of the upper surface of the polysilicon film PS1 adjacent to this region. This means that the upper surface of each of the polysilicon films PS1 is, at both ends thereof in the first direction, covered with respectively different photoresist films PR2 and is, at the center portion in the first direction, exposed from the photoresist films PR2. A region where the upper surface of the polysilicon film PS1 is exposed between the adjacent photoresist films PR2 is, in the following step, a region in which a source region of the memory cell will be formed in the main surface of the semiconductor substrate SB and a memory gate electrode will be formed on the main surface of the semiconductor substrate SB.

Figure 6:
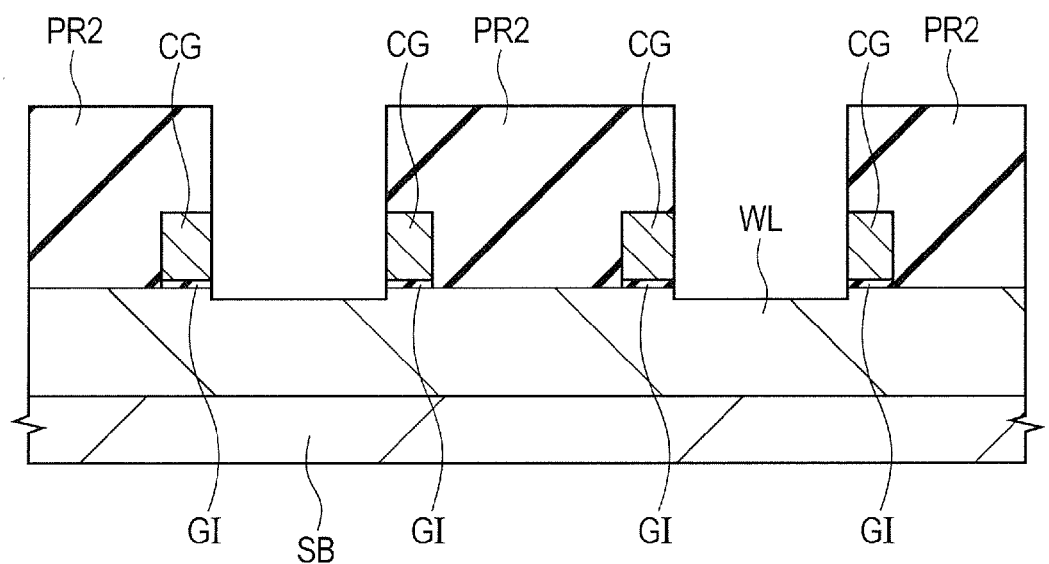
FIG. 6 is a cross-sectional view of the semiconductor device during a manufacturing step thereof following that of FIG. 5.

Next, as shown in FIG. 6, dry etching (anisotropic etching) is performed with the photoresist film PR2 as a mask to remove a portion of the polysilicon film PS1, a portion of the insulating film IF1, and a portion of the upper surface of the semiconductor substrate SB. This dry etching is terminated once at the time when the etching reaches the insulting film IF1 and then dry etching is resumed to lower the main surface level of the semiconductor substrate SB, for example, by from about 10 to 30 nm. As a method for controlling the lowering distance of the main surface level of the semiconductor substrate SB, time of etching performed after etching reaches the insulating film IF1 may be set to control an etching amount.

The above-described dry etching operations are each performed under conditions under which silicon (Si) is easily removable and the insulating film IF1 made of, for example, a silicon oxide film is removed (broken through) by etching under these conditions. It is also possible, after removal of the polysilicon film PS1 under conditions under which silicon (Si) is easily removable, to remove the insulating film IF1 under conditions changed to facilitate removal of silicon oxide ($SiO_2$), and then partially remove the main surface of the semiconductor substrate SB under conditions set again to facilitate removal of silicon (Si).

The pattern of the polysilicon film PS1 shown in FIG. 5 is separated by removing only the center portion thereof in the first direction. A plurality of control gate electrodes each made of the polysilicon film PS1 are thus formed. This means that two control gate electrodes CG are formed by processing one of the patterns. The control gate electrodes CG extend in the second direction and a plurality of them are arranged in the first direction. The first direction is a gate length direction of the control gate electrodes CG and the second direction is a gate width direction of the control gate electrodes CG. By the above-described etching, a gate insulating film GI comprised of the insulating film IF1 is formed right below each of the control gate electrodes CG.

By the above-described etching, a portion of the main surface level of the semiconductor substrate SB lowers. In some regions, therefore, a recess (trench), that is, a region partially dented from the main surface of the semiconductor substrate SB is formed between the control gate electrodes CG adjacent to each other. The depth of this recess, that is, the distance of the recess from the main surface of the semiconductor substrate SB in a direction perpendicular to the main surface of the semiconductor substrate SB is smaller than the formation depth of the element isolation region and the formation depth of the well WL.

Figure 7:
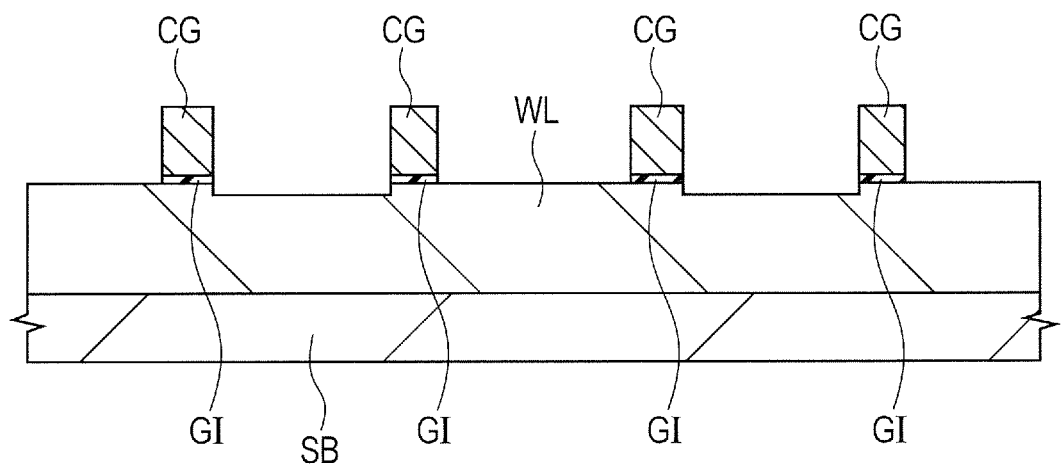
FIG. 7 is a cross-sectional view of the semiconductor device during a manufacturing step thereof following that of FIG. 6.

Next, as shown in FIG. 7, the photoresist film PR2 is removed by asking or the like. The semiconductor substrate has the recess in the main surface between a specific one of the control gate electrodes CG and one of the control gate electrodes adjacent thereto in the first direction. On the other hand, the semiconductor substrate SB does not have the recess in the main surface between the specific control gate electrode CG and the other one of the control gate electrodes adjacent to the specific control gate electrode CG in the first direction. In short, the semiconductor substrate SB has the recess in the main surface in one of the regions on the side of a specific control gate electrode CG and the semiconductor substrate SB does not have the recess in the main surface in the other region on the side of the specific control gate electrode CG.

The height of the main surface of the semiconductor substrate SB exposed from the stacked film of the gate insulating film GI and the control gate electrode CG and having no recess is almost equal to the height of the main surface of the semiconductor substrate SB right below the gate insulating film GI. The height of the upper surface of the semiconductor substrate SB which is the bottom surface of the recess is at a position lower by, for example, from 10 to 30 nm relative to the main surface of the semiconductor substrate SB in the region having no recess therein.

As described above, the control gate electrode CG is formed not by etching the polysilicon film PS1 (refer to FIG. 1) once but by processing the polysilicon film PS1 twice in total. Described specifically, one of the side walls of the control gate electrode CG is formed by the first etching described referring to FIG. 3 and the other side wall of the control gate electrode CG is formed by second etching described referring to FIG. 6.

The first etching which is terminated on the main surface of the semiconductor substrate SB and the second etching for lowering the main surface level of the semiconductor substrate SB to form the recess can be carried out while changing the etching order. From the standpoint of preventing a residue from remaining on the semiconductor substrate SB, the first etching is preferably followed by the second etching as described referring to FIGS. 1 to 7, because as will be described later, a residue may occur when a three-layer resist film is used as the photoresist film PR2 (refer to FIG. 5).

The three-layer resist film is a film having an underlying layer, an intermediate layer, and an upper resist layer formed on the semiconductor substrate in order of mention. The upper resist layer has photosensitivity and can be pattern-transferred by exposure and development. The intermediate layer contains carbon (C) or the like and has high storage stability. The underlying layer used in combination with the intermediate layer has an antireflective effect.

When a film (polysilicon film) to be processed is processed while using the three-layer resist film as the photoresist film PR2, the upper resist layer is patterned by exposure and development first and then the intermediate layer is patterned by etching with the upper resist layer as a mask. The upper resist layer is gradually thinned and is then removed by the etching while a portion of the intermediate layer is removed during etching. With the pattern of the intermediate layer as a mask, etching is performed to pattern the underlying layer. By this etching, the intermediate layer is gradually thinned and is then removed. With the resulting underlying layer as a mask, etching is performed to pattern the film (polysilicon film) to be processed. The underlying layer is then removed by asking.

When the second etching is performed first, the photoresist film PR2 to be formed for the subsequent first etching is placed in a deep trench including the recess formed in the main surface of the semiconductor substrate SB by the second etching. Since the underlying layer is formed along the deep trench, a dent is formed in the upper surface of the underlying layer right above the recess and the dent is filled with the intermediate layer. When patterning is performed using such a three-layer resist film including the intermediate layer, only the intermediate layer may remain right above the recess in the main surface of the semiconductor substrate SB during patterning of the underlying layer with the intermediate layer as a mask.

The carbon-containing intermediate layer remains even after asking for removing the underlying layer. It causes the problem that the residue made of the intermediate layer remains on the semiconductor substrate SB. The first etching is therefore preferably followed by the second etching.

Figure 8:
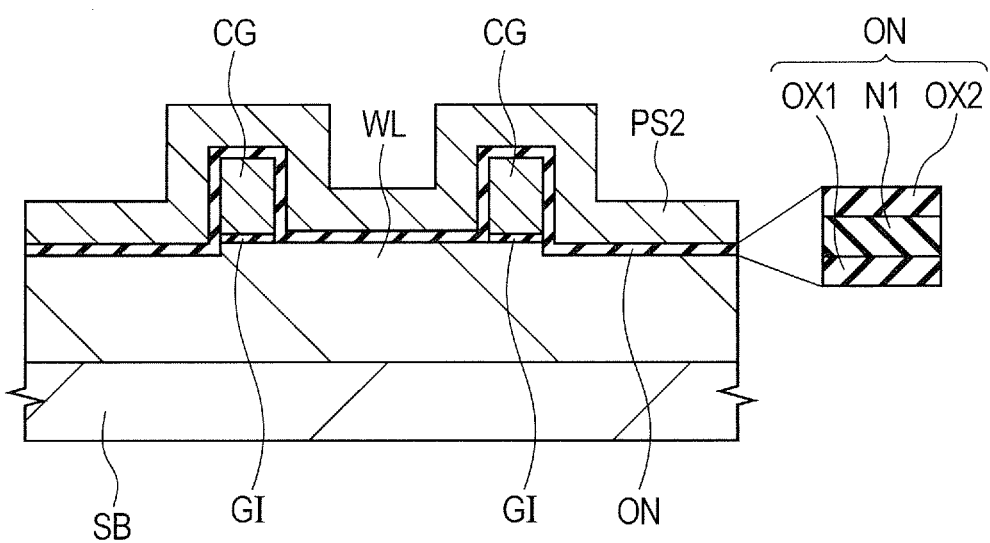
FIG. 8 is a cross-sectional view of the semiconductor device during a manufacturing step thereof following that of FIG. 7.

Next, as shown in FIG. 8, an ONO (oxide-nitride-oxide) film ON which is a stacked film for gate insulating film of a memory transistor is formed on the entire main surface of the semiconductor substrate SB. The ONO film ON covers therewith the upper surface of the semiconductor substrate SB and the side wall and the upper surface of the stacked film comprised of the gate insulating film GI and the control gate electrode CG. To facilitate understanding, FIGS. 8 to 12 show only the cross-section of a portion of the region which is shown in the cross-section of FIG. 7 and at the same time, is in the vicinity of the two central control gate electrodes CG. This means that FIG. 8 shows two recesses formed in the main surface of the semiconductor substrate SB and adjacent to each other in the first direction and a pair of control gate electrodes CG between these two adjacent recesses.

Drawings after FIG. 8 except the enlarged cross-sectional view shown partially in FIG. 8 omit the stacked structure of the stacked film configuring the ONO film ON. In other words, no boundary between films configuring the ONO film ON is shown. The ONO film ON is an insulating film having therein a charge storage portion. More specifically, the ONO film ON is comprised of a stacked film of a first silicon oxide film (bottom oxide film) OX1, formed on the semiconductor substrate SB, a silicon nitride film N1 formed on the first silicon oxide film OX1, and a second silicon oxide film (top oxide film) OX2 formed on the silicon nitride film N1. The silicon nitride film N1 is a trapping insulating film functioning as a charge storage portion.

The first silicon oxide film OX1 and the second silicon oxide film OX2 can be formed, for example, by oxidation treatment (thermal oxidation treatment) or CVD, or a combination thereof. The above oxidation treatment may be ISSG oxidation. The silicon nitride film N1 can be formed, for example, by CVD. The first silicon oxide film OX1 and the second silicon oxide film OX2 each have a thickness of, for example, from about 2 to 10 nm and the silicon nitride film N1 has a thickness of, for example, from about 5 to 15 nm.

Next, a polysilicon film PS2 is formed on the entire main surface of the semiconductor substrate SB by using, for example, CVD so as to cover the surface of the ONO film ON. The exposed side wall and upper surface of the ONO film ON are thereby covered with the polysilicon film PS2. This means that the polysilicon film PS2 is formed on the side wall of the control gate electrode CG via the ONO film ON. The polysilicon film PS2 has a thickness smaller than that of the polysilicon film PS1 (refer to FIG. 1).

The polysilicon film PS2 can also be obtained by forming an amorphous silicon film at the time of film formation and then making it polycrystalline by heat treatment. The polysilicon film PS2 is a film having, for example, an n type impurity (for example, phosphorus (P)) introduced therein at a relatively high concentration. Alternatively, a polysilicon film PS2 not containing an impurity is formed and then an impurity is introduced by an implantation step for forming source and drain regions if necessary. The polysilicon film PS2 is a conductor film for forming a memory gate electrode MG which will be described later.

The term "film thickness" as used herein means, when the film is a specific film, a thickness of the film in a direction perpendicular to the surface of a film lying under the specific film. For example, when the polysilicon film PS2 is formed on and along the surface extending along the main surface of the semiconductor substrate SB such as the upper surface of the ONO film ON, the term "thickness of the polysilicon film PS2" means a thickness of the polysilicon film PS2 in a direction perpendicular to the main surface of the semiconductor substrate SB. In the case of a portion of the polysilicon film PS2 formed in contact with a wall perpendicular to the main surface of the semiconductor substrate SB such as the side wall of the ONO film ONO, the term "film thickness of the polysilicon film PS2" means the thickness of the polysilicon film PS2 in a direction perpendicular to the side wall.

The ONO film ON and the polysilicon film PS2 are also placed inside the recess formed by lowering of the main surface level of the semiconductor substrate SB on the side of each of the control gate electrodes CG. When the recess is adequately deep, the bottom surfaces of the ONO film and the polysilicon film PS2 in the recess are positioned in a region lower than the interface between the gate insulating film GI and the semiconductor substrate SB. When the depth of the recess is smaller than the thickness of the ONO film, however, the polysilicon film PS2 is not formed in the recess and the bottom surface of the polysilicon film PS2 right above the recess stays in a region higher than the interface between the gate insulating film GI and the main surface of the semiconductor substrate SB.

Figure 9:
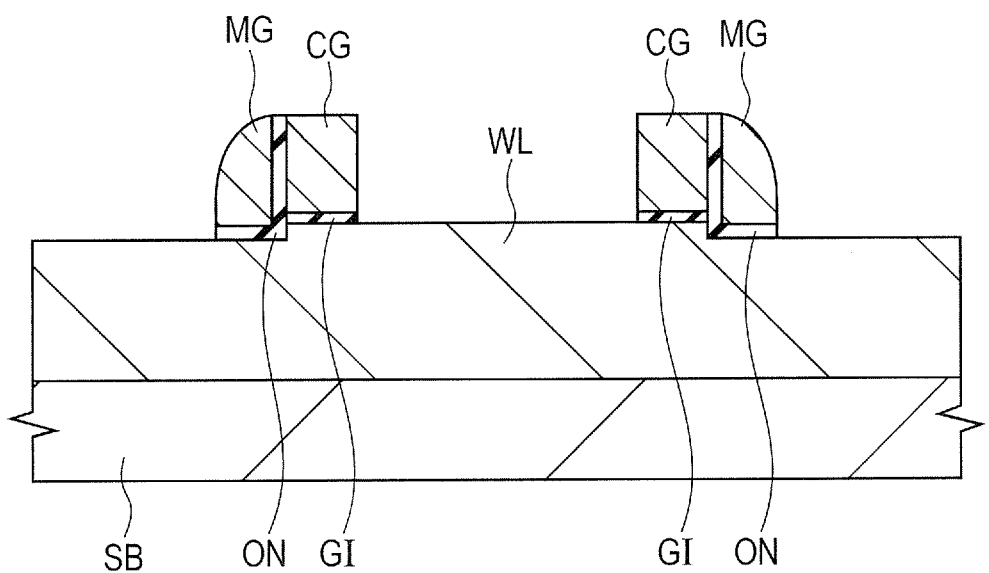
FIG. 9 is a cross-sectional view of the semiconductor device during a manufacturing step thereof following that of FIG. 8.

As shown in FIG. 9, the upper surface of the ONO film ON is exposed by etching back the polysilicon film PS2 by dry etching. In this etching back step, the polysilicon film PS2 is anisotropically etched (etched back) to leave the polysilicon film PS2 in sidewall form via the ONO film ON on both side walls of the stacked film comprised of the gate insulating film GI and the control gate electrode CG. As a result, a memory gate electrode MG comprised of the polysilicon film PS2 which has remained in sidewall form is formed, via the ONO film ON, on the side wall adjacent to the recess of the main surface of the semiconductor substrate SB.

A photoresist pattern (not shown) is formed on the semiconductor substrate SB by photolithography, which covers the memory gate electrode MG adjacent to one of the side walls of each of the control gate electrodes and exposes the polysilicon film PS2 adjacent to the other side wall of the control gate electrode CG. Then, by etching with the photoresist pattern as an etching mask, the polysilicon film PS2 formed on the side opposite to the memory gate electrode MG with the control gate electrode CG therebetween is removed. The photoresist pattern is then removed. At this time, the memory gate electrode MG remains without being etched because it is covered with the photoresist pattern.

Then, a portion of the ONO film ON exposed without being covered with the memory gate electrode MG is removed by etching (for example, wet etching). The ONO film ON right below the memory gate electrode MG remains without being removed by this etching. Similarly, the ONO film ON positioned between the stacked film comprised of the gate insulating film GI and the control gate electrode CG and the memory gate electrode MG remains without being removed. Since the ONO film ON is removed from the other region, the upper surface of the semiconductor substrate SB is exposed and also the upper surface of the control gate electrode CG is exposed. In addition, the side wall which is of the control gate electrode CG and not adjacent to the memory gate electrode MG is exposed.

In such a manner, the memory gate electrode MG is formed on the semiconductor substrate SB so as to be adjacent to the control gate electrode CG via the ONO film ON having therein a charge storage portion. This means that the memory gate electrode MG is formed right above the upper surface of the semiconductor substrate SB in a region which is adjacent to the control gate electrode CG and has the recess in the main surface of the semiconductor substrate SB. The memory gate electrode MG is, on the other hand, not formed in a region which is adjacent to the control gate electrode CG and does not have the recess in the main surface of the semiconductor substrate SB. Although not shown in the drawing, the memory gate electrode MG is formed at both ends of the recess in the first direction and the upper surface of the semiconductor substrate SB is exposed in a region which is a portion of the recess and adjacent to the memory gate electrode MG.

The bottom surface of the ONO film ON is in contact with the bottom surface of the recess, that is, the upper surface of the semiconductor substrate SB. The side wall of the ONO film ON on the side opposite to the side wall with which the memory gate electrode MG is in contact is in contact with the side wall of the control gate electrode CG, the side wall of the gate insulating film GI, and the side wall of the semiconductor substrate SB, that is, the side wall of the recess.

Figure 10:
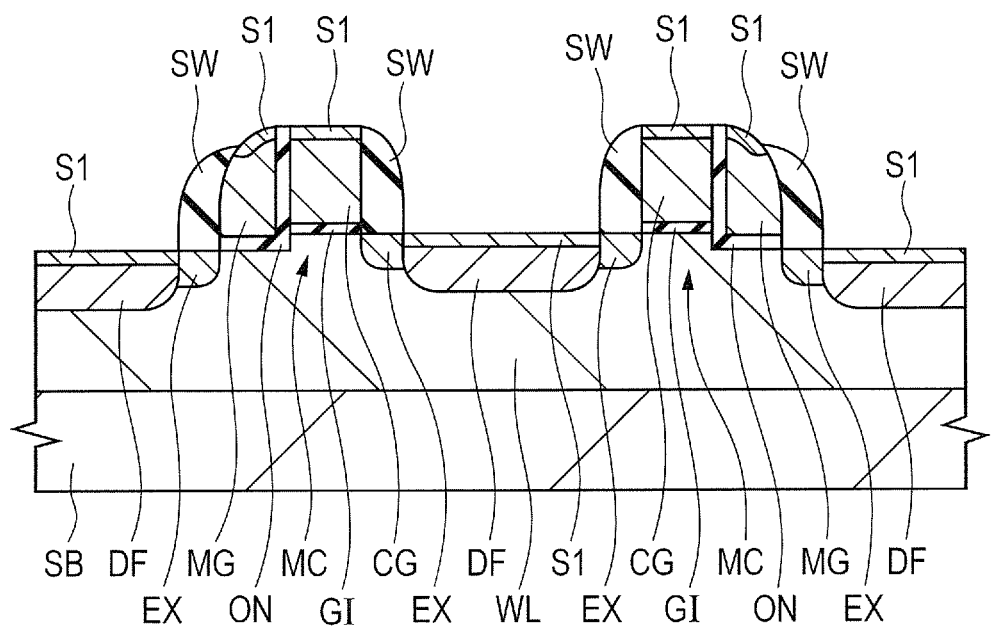
FIG. 10 is a cross-sectional view of the semiconductor device during a manufacturing step thereof following that of FIG. 9.

Next, as shown in FIG. 10, a plurality of $n^-$ semiconductor regions (impurity diffusion regions) EX are formed using ion implantation or the like. Described specifically, a plurality of $n^-$ semiconductor regions EX are formed by introducing an n type impurity, for example, arsenic (As) or phosphorus (P) into the main surface of the semiconductor substrate SB by ion implantation while using the control gate electrode CG, the memory gate electrode MG, the ONO film ONO, and the like as a mask (ion implantation preventing mask). The extension region EX on the side of the control gate electrode CG and the extension EX on the side of the memory gate electrode MG can be formed under respectively different conditions by using respectively different steps. In this case, the formation position of the extension regions EX may be defined using a resist pattern.

Although not shown, an offset spacer that covers the side wall of a structure comprised of the gate insulating film GI, the control gate electrode CG, the ONO film ON, and the memory gate electrode MG may be formed from, for example, a silicon nitride film or a silicon oxide film, or a stacked film thereof prior to the formation of the $n^-$ semiconductor regions EX. The threshold voltage of a control transistor and a memory transistor which will be formed later may be adjusted by implanting a p type impurity (for example, B (boron)) into the vicinity of the formation region of the $n^-$ semiconductor regions EX before or after formation of the $n^-$ semiconductor regions EX.

A pair of $n^-$ semiconductor regions EX formed in the upper surface of the semiconductor substrate SB on the side of the structure including the control gate electrode CG and the memory gate electrode MG configures a portion of source and drain regions of a control transistor and a memory transistor which will be formed later. Of the $n^-$ semiconductor regions EX pair, the $n^-$ semiconductor region EX on the side of the memory gate electrode MG is formed in the upper surface of the semiconductor substrate SB which is a bottom surface of the recess in the main surface of the semiconductor substrate SB.

Side walls SW that cover the side walls on both sides of the structure, respectively, are then formed. The side walls SW can be formed in self alignment by forming, for example, a silicon oxide film and a silicon nitride film successively on the semiconductor substrate SB using, for example, CVD and then partially removing the silicon oxide film and the silicon nitride film by anisotropic etching to expose the upper surface of the semiconductor substrate SB and the respective upper surfaces of the control gate electrode CG and the memory gate electrode MG. The side walls SW may each be a stacked film, but no boundary between films configuring the stacked film is shown in the drawings.

A plurality of $n^+$ semiconductor regions (impurity diffusion regions) DF are then formed in the upper surface of the semiconductor substrate SB by ion implantation or the like. The plurality of $n^+$ semiconductor regions DF can be formed by introducing an n type impurity (for example, arsenic (As) or phosphorus (P)) into the main surface of the semiconductor substrate SB by ion implantation while using the control gate electrode CG, the memory gate electrode MG, the ONO film ON, and the side wall SW as a mask. The $n^+$ semiconductor regions DF have an impurity concentration higher and have a junction depth greater than those of the $n^-$ semiconductor regions EX. The $n^+$ semiconductor regions DF may have a junction depth smaller than that of the $n^-$ semiconductor regions EX.

The structure has, on the sides thereof, a pair of $n^+$ semiconductor regions DF. Of the $n^+$ semiconductor region DF pair, the $n^+$ semiconductor region DF on the side of the memory gate electrode MG is formed in the upper surface of the semiconductor substrate SB which is a bottom surface of the recess in the main surface of the semiconductor substrate SB.

As a result, source and drain regions having an LDD (lightly doped drain) structure is formed, which is comprised of the $n^-$ semiconductor region EX serving as an extension region and the $n^+$ semiconductor region DF which is a diffusion layer having an impurity concentration higher than that of the $n^-$ semiconductor regions EX. Activation annealing is then performed. It is heat treatment for activating the impurities introduced into the semiconductor regions ($n^-$ semiconductor regions EX and $n^+$ semiconductor regions DF) for source and drain regions.

The pair of $n^+$ semiconductor regions DF formed in the upper surface of the semiconductor substrate SB on the side of the structure including the control gate electrode CG, the memory gate electrode MG, and the side walls SW configures a portion of the source and drain regions of a control transistor and a memory transistor. This means that the control gate electrode CG and a pair of source drain regions on the side thereof configure a control transistor. The memory gate electrode MG and a pair of source and drain regions on the side thereof configure a memory transistor.

The control transistor and the memory transistor configure a memory cell MC of a split gate type MONOS memory. By the above-described steps, the memory cell MC can therefore be formed.

A silicide layer S1 is then formed. The silicide layer S1 can be formed by performing a so-called salicide (self aligned silicide) process. More specifically, the silicide layer S1 can be formed as described below.

First, a metal film for the formation of the silicide layer S1 is formed (deposited) on the entire main surface of the semiconductor substrate SB including the respective upper surfaces of the $n^+$ type semiconductor region DF, the control gate electrode CG, and the memory gate electrode MG. As the metal film, a metal film (pure metal film) composed only of a single metal or an alloy film can be used. The metal film is made of, for example, a cobalt (Co) film, a nickel (Ni) film, or a nickel platinum alloy film and can be formed using sputtering or the like.

Figure 11:
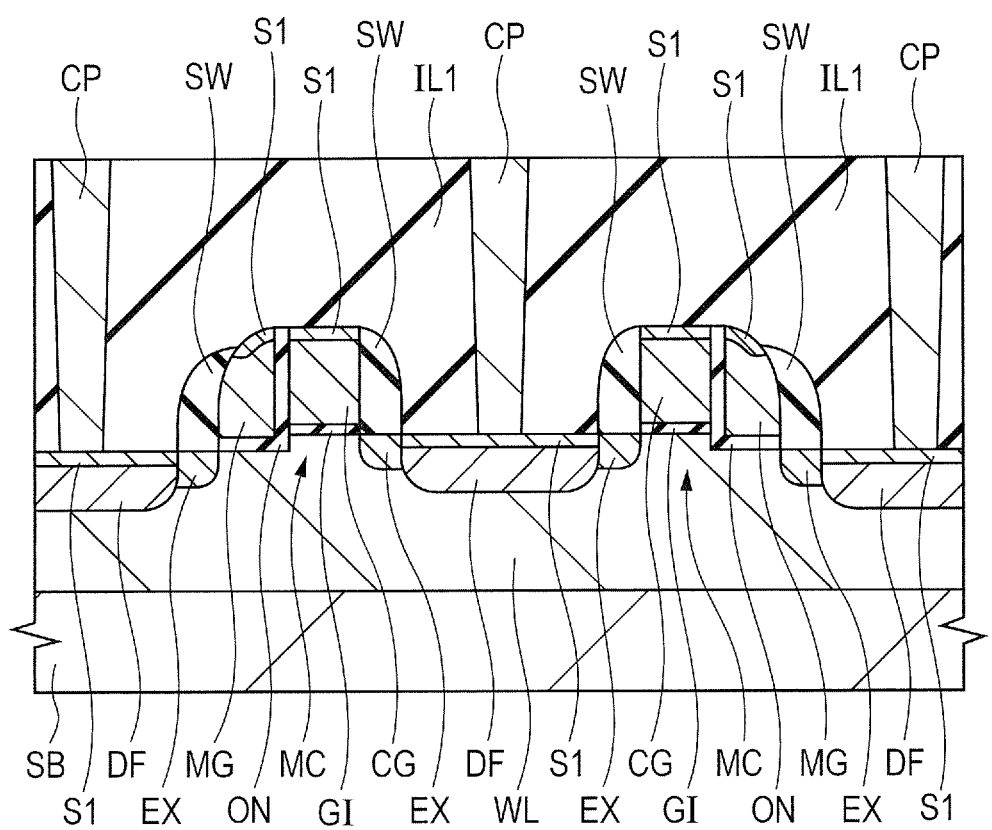
FIG. 11 is a cross-sectional view of the semiconductor device during a manufacturing step thereof following that of FIG. 10.

The semiconductor substrate SB is then heat treated (heat treated for the formation of a silicide layer S1) to cause a reaction between the metal film and each surface layer portion of the $n^+$ type semiconductor region DF, the control gate electrode CG, and the memory gate electrode MG. A silicide layer S1 is thereby formed on each of the $n^+$ type semiconductor region DF, the control gate electrode CG, and the memory gate electrode MG. An unreacted portion of the metal film is then removed by wet etching or the like to obtain a structure as shown in FIG. 11. The silicide layer S1 may be, for example, a cobalt silicide layer, a nickel silicide layer, or a nickel platinum silicide layer.

Next, as shown in FIG. 11, an interlayer insulating film IL1 is formed on the entire main surface of the semiconductor substrate SB so as to cover the memory cell MC. The interlayer insulating film IL1 is made of, for example, a film composed only of a silicon oxide film and can be formed, for example, by CVD. The interlayer insulating film IL1 formed here has, for example, a thickness greater than that of the control gate electrode CG. In FIG. 11 and drawings thereafter, although not shown therein, a silicon nitride film (etching stopper film) having a role of stopping etching once in the etching step for the formation of a contact hole which will be described later is formed between the main surface of the semiconductor substrate SB and the interlayer insulating film IL1. The etching stopper film and the interlayer insulating film IL1 are thus formed successively on the semiconductor substrate SB.

The upper surface of the interlayer insulating film IL1 is then polished using CMP (chemical mechanical polishing) or the like. A plurality of contact plugs CP are thus formed.

Described specifically, the interlayer insulating film IL1 is dry etched using, as an etching mask, a photoresist pattern (not shown) formed on the interlayer insulating film IL1 by photolithography. A plurality of contact holes (openings, through-holes) that penetrate the interlayer insulating film IL1 are thereby formed.

From the bottom portion of each of the contact holes, a portion of the silicide layer S1 on the surface of the $n^+$ type semiconductor region DF which is a portion of the main surface of the semiconductor substrate SB, a portion of the silicide layer S1 on the surface of the control gate electrode CG, a portion of the silicide layer S1 on the surface of the memory gate electrode MG, and the like is exposed. Contact holes right above the control gate electrode CG and the memory gate electrode MG, respectively, are formed in a region not shown in the drawings.

A plurality of conductive contact plugs CP made of tungsten (W) or the like are formed as a connection conductor in the contact holes, respectively. The contact plugs CP are formed, for example, by forming a barrier conductor film (for example, a titanium film, a titanium nitride film, or a stacked film thereof) on the interlayer insulating film IL1 including the inside of the contact holes. Then, a main conductor film made of a tungsten film or the like is formed on this barrier conductor film so as to completely fill each of the contact holes therewith and then, unnecessary portions of the main conductor film and the barrier conductor film outside the contact holes are removed by CMP or etch back to form contact plugs CP.

The contact plugs CP that have filled the contact holes are electrically coupled to the respective upper portions of the $n^+$ type semiconductor region DF, the control gate electrode CG, and the memory gate electrode MG. The contact plugs CP are coupled to the upper surface of the silicide layer S1 on the $n^+$ type semiconductor region DF, the upper surface of the silicide layer S1 on the control gate electrode CG, the upper surface of the silicide layer S1 on the memory gate electrode MG, and the like.

To simplify the drawing, FIG. 11 shows the barrier conductor film and the main conductor film (tungsten film) configuring the contact plug CP as one body. The cross-sectional view of FIG. 11 includes neither the contact hole nor the contact plug CP on each of the control gate electrode CG and the memory gate electrode MG. This means the contact plugs CP is coupled to the control gate electrode CG and the memory gate electrode MG, which extend in the gate width direction, in a region not shown in this drawing.

Figure 12:
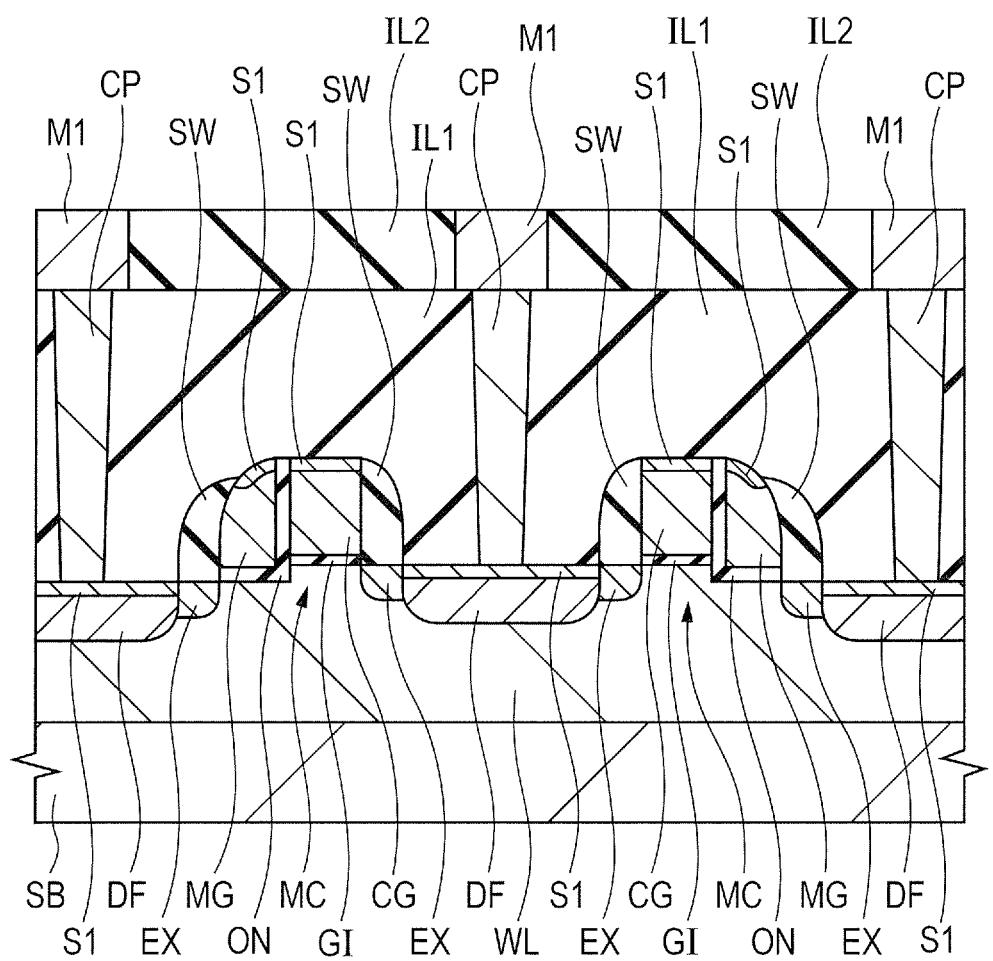
FIG. 12 is a cross-sectional view of the semiconductor device during a manufacturing step thereof following that of FIG. 11.

Next, as shown in FIG. 12, a first wiring layer including a first-layer wiring M1 is formed on the interlayer insulating film IL1 filled with the contact plug CP. The wiring M1 can be formed using so-called single damascene technology. The first wiring layer has an interlayer insulating film IL2 and the first-layer wiring M1 penetrating the interlayer insulating film IL2. The wiring M1 is, at the bottom surface thereof, coupled to the upper surface of the contact plug CP. Although steps thereafter are omitted from the drawing, a second wiring layer, a third wiring layer, and the like are formed successively on the first wiring layer to form a stacked wiring layer and then, the semiconductor wafer is individualized by a dicing step into a plurality of semiconductor chips. The semiconductor device of the present embodiment is manufactured in such a manner.

<Operation of Nonvolatile Memory>

Next, operation examples of a nonvolatile memory will be described referring to FIG. 26.

FIG. 26 is a table showing one example of voltage application conditions to each site of a select memory cell during "write", "erase", and "read" in the present embodiment. The table in FIG. 26 includes a voltage Vmg to be applied to the memory gate electrode MG of the memory cell MC as shown in FIG. 12, a voltage Vs to be applied to the source region, a voltage Vcg to be applied to the control gate electrode CG, a voltage Vd to be applied to the drain region, and a base voltage Vb to be applied to the well WL in the upper surface of the semiconductor substrate at the time of "write", "erase", and "read". The term "selected memory cell" as used herein means a memory cell selected as an object of "write", "erase", or "read" operation. In the example of the nonvolatile memory shown in FIG. 12, an active region on the side of the memory gate electrode MG is a source region, while an active region on the side of the control gate electrode CG is a drain region.

An example of preferred voltage application conditions is shown in the table of FIG. 26. The conditions are not limited to them, but can be changed variously if necessary. Further, in the present embodiment, injection of electrons and injection of holes into the silicon nitride film N1 (refer to FIG. 13), which is a charge storage portion in the ONO film ON (refer to FIG. 12) of the memory transistor, are defined as "write" and "erase", respectively.

In the table of FIG. 26, the column A corresponds to an operation system using SSI for writing and BTBT for erasing; and the column B corresponds to an operation system SSI for writing and FN for erasing.

The SSI system can be regarded as an operation system in which writing to memory cells is performed by injecting hot electrons into the silicon nitride film. The BTBT system can be regarded as an operation system in which erasing of memory cells is performed by injecting hot holes into the silicon nitride film. The FN system can be regarded as an operation system in which erasing is performed by tunneling of holes. In other words, the FN erase can be regarded as an operation system in which erasing of memory cells is performed by injecting holes into the silicon nitride film by making use of a FN tunneling effect. They will be described more specifically.

In the present embodiment, a write system (hot electron injection write system) in which writing is performed by hot electron injection through "SSI (source side injection) system can be used.

In writing using the SSI system, writing is performed, for example, by applying voltages (Vmg=12 V, Vs=6 V, Vcg=1.5 V, Vd=1 V, Vb=0 V) as shown in "write operation voltage" in the column A or column B in the table of FIG. 26 to respective sites of the selected memory cell that performs writing and thereby injecting electrons into the silicon nitride film in the ONO film ON of the selected memory cell.

In this case, hot electrons are generated in the semiconductor substrate SB below and between two gate electrodes (memory gate electrode MG and control gate electrode CG), that is, in the channel region (between the source and the drain) and the resulting hot electrons are injected into the silicon nitride film, which is a charge storage portion in the ONO film ON below the memory gate electrode MG. The injected hot electrons (electrons) are trapped in the trap level in the silicon nitride film NT in the ONO film ON. This leads to an increase in the threshold voltage of the memory transistor. This means that the memory transistor is brought to a write state.

The erase system includes a system (hot hole injection erase system) in which erasing is performed by injecting hot holes generated by a so-called BTBT system, that is, BTBT (band-to-band tunneling: inter-band tunneling phenomenon) and a system (tunneling erase system) in which erasing is performed by a so-called FN system, that is, FN (Fowler Nordheim) tunneling.

In the BTBT erase system, erasing is performed by injecting holes generated by BTBT into a charge storage portion (the silicon nitride film in the ONO film ON). For example, voltages (Vmg=−6 V, Vs=7 V, Vcg=0 V, Vd=0 V, Vb=0 V) as shown in "erase operation voltage" in the column A in the table of FIG. 26 are applied to the respective sites of the selected memory cell that performs erasing. Thus, holes are generated in the semiconductor substrate SB by the BTBT phenomenon, and being accelerated under an electric field, they are injected into the silicon nitride film in the ONO film ON of the selected memory cell. This leads to reduction in the threshold voltage of the memory transistor. The memory transistor is thereby brought to an erase state.

In the FN erase system, erasing is performed by applying voltages (Vmg=12V, Vs=0V, Vcg=0V, Vd=0V, Vb=0V) as shown by "erase operation voltage" in the column B in the table of FIG. 26 to the respective sites of the selected memory cell that performs erasing; and injecting, into the silicon nitride film in the ONO film ON, holes which have been tunneled from the memory gate electrode MG in the selected memory cell. In this case, the holes are injected from the memory gate electrode MG into the ONO film ON while tunneling through the second silicon oxide film (top oxide film) by FN tunneling (FN tunneling effect); and are trapped in the trap level in the silicon nitride film in the ONO film ON or bind to electrons trapped in the ONO film ON and disappear. This results in reduction in the threshold voltage of the memory transistor. This means that the memory transistor is brought to an erase state.

During reading, for example, voltages as shown by "read operation voltage" in the column A or column B in the table of FIG. 26 are applied to the respective sites of the selected memory cell that performs reading. The write state and the erase state can be discriminated by defining the voltage Vmg to be applied to the memory gate electrode MG during reading to a value between the threshold voltage of the memory transistor in the write state and the threshold voltage in the erase state.

Advantages of the Present Embodiment

Figure 13:
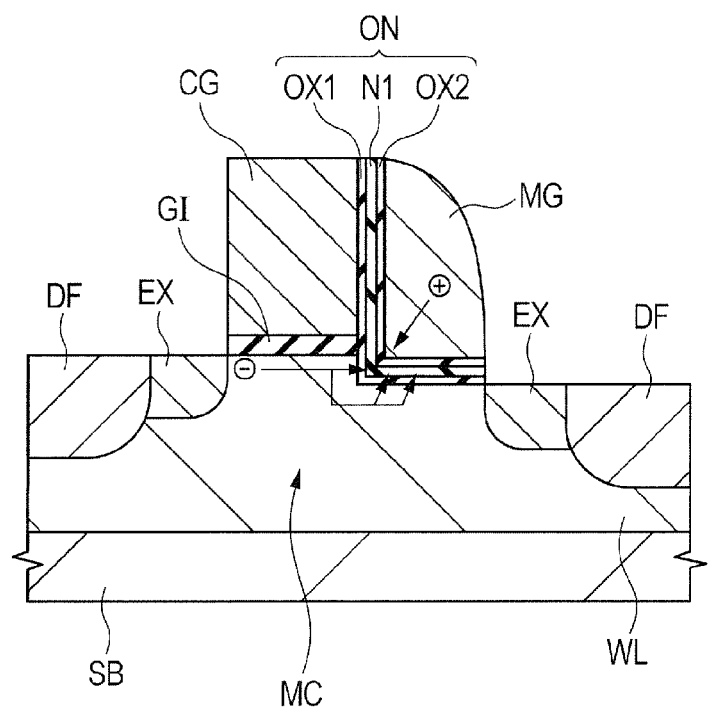
FIG. 13 is a cross-sectional view describing the operation of the semiconductor device of First Embodiment.
Figure 23:
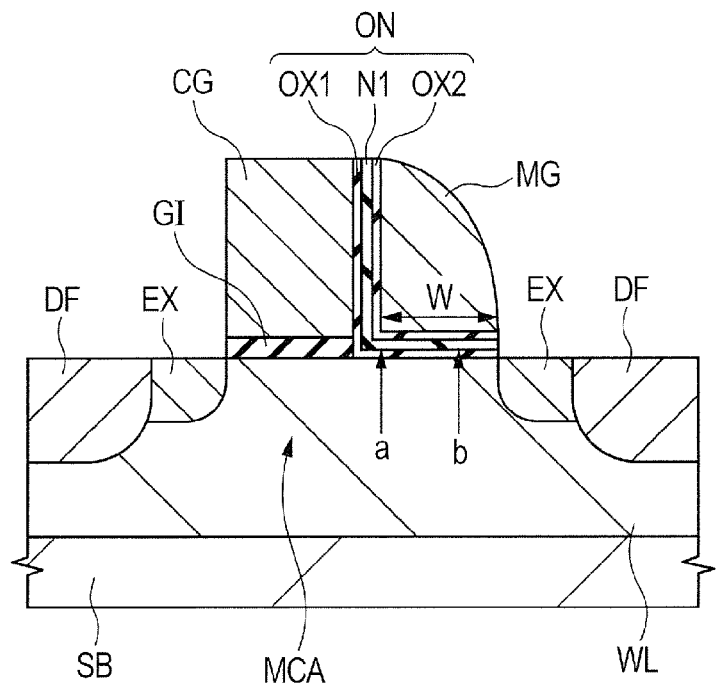
FIG. 23 is a cross-sectional view describing the operation of a semiconductor device of a comparative example.
Figure 24:
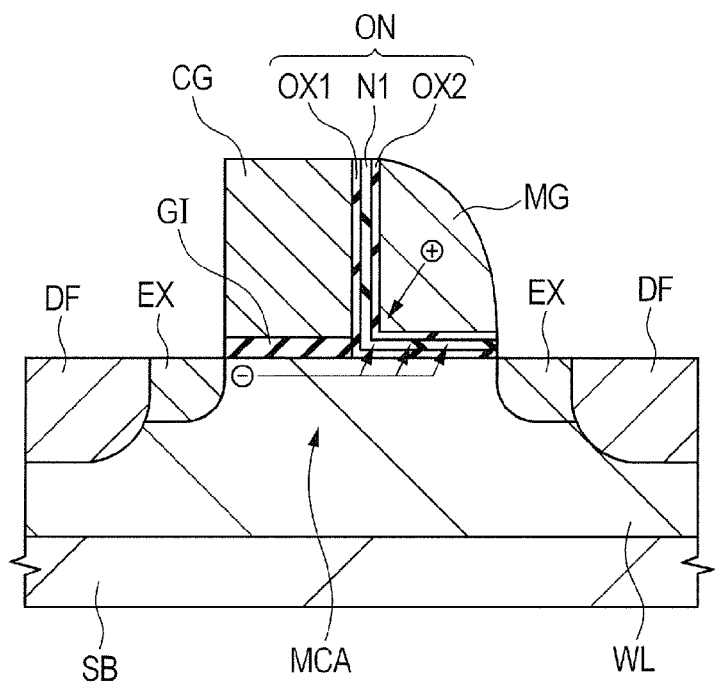
FIG. 24 is another cross-sectional view describing the operation of the semiconductor device of the comparative example.
Figure 25:
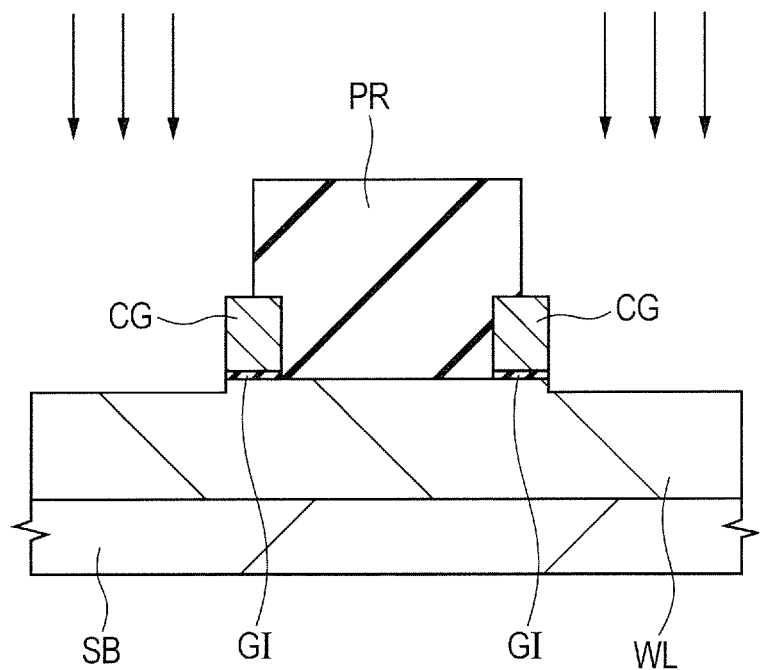
FIG. 25 is a cross-sectional view of a semiconductor device of another comparative example during a manufacturing step thereof.

Problems of a semiconductor device of comparative examples shown in FIGS. 23 to 25 will next be described and advantage of the present embodiment will be described referring to FIG. 13. FIGS. 23 and 24 are cross-sectional views of a semiconductor device for describing the operation of a comparative example and FIG. 25 is a cross-sectional view of a semiconductor device of another comparative example during a manufacturing step thereof. FIG. 13 is a cross-sectional view for describing the operation of the semiconductor device of the present embodiment.

The semiconductor devices of comparative examples shown in FIGS. 23 and 24 have a split gate type memory cell MCA. The structure of the memory cell MCA is similar to that of the memory cell MC shown in FIG. 12 except that the semiconductor substrate SB has no recess in a region of the main surface thereof including that right below the ONO film ON and the memory gate electrode MG. This means that the main surface of the semiconductor substrate SB is almost flat and the bottom surface of the ONO film ON and the bottom surface of the gate insulating film GI right below the control gate electrode CG are almost the same.

The semiconductor substrate SB has, in the main surface thereof on the side of the memory gate electrode MG, a source region and has, in the main surface on the side of the control gate electrode CG, a drain region. FIG. 23 omits therefrom a silicide layer, a contact plug, a side wall, an interlayer insulating film, and wiring on the semiconductor substrate SB.

Data writing in the comparative example is performed by applying, for example, 1V, 6V, 12V, 1.5V, and 0V to the drain region, the source region, the memory gate electrode MG, the control gate electrode CG, and the well WL, respectively. Hot electrons are generated due to electrons flowing from the drain region side to the source region, pass through the first silicon oxide film OX1 lying below the ONO film ON, and then are injected into the silicon nitride film N1. Thus, a write operation is performed.

Data erasing is performed by applying 0V, 7V, −6V, and 0V to the drain region, the source region, and the memory gate electrode, and each of the control gate electrode CG and the well WL, respectively. Hot holes generated in the semiconductor substrate SB pass through the first silicon oxide film OX1 lying below the ONO film ON and are injected into the silicon nitride film N1, by which an erase operation is performed. This means that writing is performed by hot electron injection (that is, SSI system) from the substrate and erasing is performed by hot hole injection (that is, BTB Tsystem) from the substrate.

Hot electron injection into the silicon nitride film N1 at the time of writing occurs at a position (a) below the memory gate electrode MG and near the side of the control gate electrode CG, while hot hole injection into the silicon nitride film N1 at the time of erasing occurs at a position (b) near the source region. When a distance between (a) and (b) is large, a difference is likely to appear between the hot electron distribution in the silicon nitride film N1 at the time of writing and hot hole distribution in the silicon nitride film N1 at the time of erasing. In this case, more hot holes should be injected in order to erase electrons in the silicon nitride film N1. This causes deterioration in the first silicon oxide film OX1 as the lower layer, resulting in deterioration in data retention characteristics. In addition, due to accumulation of both electrons and holes in the silicon nitride film N1, deterioration in data rewrite resistance occurs.

Not only erase operation by hot hole injection but also erase operation by hole injection into the silicon nitride film N1 from the memory gate electrode MG by FN system causes a similar problem. As shown in FIG. 24, at the time of write operation by hot electron injection, electrons in the semiconductor substrate SB are presumed to be injected into the silicon nitride film N1 and this injection extends from the side of the control gate electrode CG to the side of the source region.

In erasing by FN system, holes are injected from the memory gate electrode MG mainly into the corner of the ONO film ON so that the problem due to disagreement of the position between writing by electron injection and erasing by hole injection may occur as in the case described referring to FIG. 23.

In order to prevent the above-mentioned problem, narrowing of a width W (refer to FIG. 23) of the memory gate electrode MG is effective. When the width W is narrowed, the distance between (a) and (b) can be decreased in the example shown in FIG. 23 and an electron injection position at the time of writing may be concentrated to the vicinity of the corner of the ONO film ON in the example shown in FIG. 24. The decrease in the width W, which is a gate length of the memory transistor, however deteriorates punch-through characteristics of the memory transistor and becomes a cause for increasing an off-leakage current of the nonvolatile memory element.

As shown in FIG. 13, therefore, by providing a difference in height between the main surface of the semiconductor substrate SB right below the control gate electrode CG and the main surface of the semiconductor substrate SB right below the memory gate electrode MG and thereby forming the ONO film ON at a position lower than the main surface of the semiconductor substrate, the channel length of the memory transistor can be increased effectively even when the width W (refer to FIG. 23) of the memory gate electrode MG is reduced. This means that the channel length corresponds to the sum of the depth (height of step difference) of a recess formed in the main surface of the semiconductor substrate SB and a distance along which the ONO film ON and the bottom surface of the recess are in contact between the source and drain regions.

The channel length can be made longer than that of the comparative example shown in FIGS. 23 and 24 so that an increase in off-leakage current can be suppressed. By decreasing the gate length (width W) of the memory gate electrode MG, a distance between a position at which electrons are injected into the silicon nitride film N1 in write operation and a position at which holes are injected into the silicon nitride film N1 in erase operation can be decreased.

In short, the position (a) at which electrons are injected and the position (b) at which holes are injected, each shown in FIG. 23 can be made closer and overlapped with each other.

As shown in FIG. 13, in write operation, some electrons in the semiconductor substrate SB transfer in the semiconductor substrate SB below the control gate electrode CG toward the side of the source region, go straight, and then are injected into the ONO film ON from the side wall of the recess. Many electrons that do not go straight but go to the bottom surface side of the ONO film ON are injected into the vicinity of the corner of the ONO film ON. In such a structure, compared with the structure having therein no recess as shown in FIG. 24, electron injection concentrates on the vicinity of the corner of the ONO film ON. As a result, an electron injection range can be overlapped with a FN hole injection range.

Extra hole injection for erasing electrons in the silicon nitride film N1 therefore becomes unnecessary. Without causing an increase in off-leakage current, improvement in rewrite resistance and data retention characteristics can be achieved.

As a manufacturing method for forming a recess in a portion of the main surface of a semiconductor substrate and lowering the respective formation positions of the ONO film and the memory gate electrode MG, the following method is presumed to be used. First, a step described referring to FIG. 1 is performed. As shown in FIG. 25 as a comparative example, the control gate electrode CG comprised of the polysilicon film PS1 (refer to FIG. 1) may be formed by single processing using photolithography and dry etching and then, the main surface of the semiconductor substrate SB in the vicinity of one of the side walls of each of the control gate electrodes may be lowered by etching while covering the other side wall of each of the control gate electrodes.

More specifically, as shown in FIG. 25, etching is performed once to form a side wall on both sides of the control gate electrode CG to thereby form a pattern of the control gate electrode CG and then, a photoresist film PR that ends right above the control gate electrode CG is formed. The photoresist film PR is a resist pattern that covers one of the side walls of each of the control gate electrodes CG and exposes the other side wall. This means that of the main surfaces of the semiconductor substrate SB on the side of each of the control gate electrodes CG in the gate length direction, the main surface of the semiconductor substrate SB on the side of one of the side walls is covered with the photoresist film PR and the main surface of the semiconductor substrate SB on the side of the other side wall is exposed from the photoresist film PR.

With this photoresist film PR as a mask, isotropic or anisotropic etching is performed to remove a portion of the main surface of the semiconductor substrate SB exposed from the photoresist film PR and thereby form a recess in the main surface of the semiconductor substrate SB. Steps described referring to FIGS. 8 to 12 are then performed to form, as shown in FIG. 13, a structure having a step difference on the main surface of the semiconductor substrate SB right below the memory gate electrode MG.

When with miniaturization of semiconductor devices, the size of the control gate electrode CG is reduced, it becomes difficult to terminate the photoresist film PR right above the control gate electrode CG as shown in FIG. 25. For example, when the control gate electrode CG has a gate length of 60 nm and the overlapping precision with the formation position of the control gate electrode CG, during exposure for the formation of the photoresist film PR, is ±30 nm, the maximum overlapping misalignment terminates the formation of the photoresist film PR right above the side wall of the control gate electrode CG.

Further, due to factors such as variations in the size of the control gate electrode CG and variations in the size of the photoresist film PR, the photoresist film PR protrudes to the side of the source region of the control transistor and the photoresist film PR may cover the entirety of the control gate electrode CG and the main surface of the semiconductor substrate SB on both sides of the control gate electrode CG. When the entirety of one of the control gate electrodes CG adjacent to each other is covered with the photoresist film PR, the entirety of the other control gate electrode CG is exposed from the photoresist film PR. As a result, the main surface of the semiconductor substrate SB on the side of the drain region of the control transistor may be exposed.

When the entirety of one of the control gate electrodes CG is covered with the photoresist film PR, etching of the main surface of the semiconductor substrate SB on the side of the source region does not start from the end portion of the control gate electrode CG. When the entirety of one of the control gate electrodes CG is exposed from the photoresist film PR, the main surface of the semiconductor substrate SB adjacent to the end portion of the control gate electrode CG on the side of the drain region is etched and lowers similar to that on the side of the source region. The cross-sectional shape as shown in FIG. 13 cannot therefore be obtained and some semiconductor devices fail to operate normally. This means an increase in a defective rate in the manufacturing steps of the semiconductor device so that the semiconductor device thus obtained has deteriorated reliability. If the size of the control gate electrode CG cannot be reduced in order to avoid such a problem, miniaturization of the semiconductor device cannot be achieved.

In the present embodiment, as described referring to FIGS. 2 to 7, the control gate electrode CG is formed by processing the polysilicon film PS1 gradually by etching twice. When the resist pattern of the photoresist film PR2 shown in FIG. 5 is formed by exposure, the width of the polysilicon film PS1 in the first direction is greater than the gate length of the control gate electrode CG shown in FIG. 25 so that the photoresist film PR2 can be terminated easily right above the polysilicon film PS1.

For the formation of the control gate electrode CG (refer to FIG. 7) having a gate length of, for example, 60 nm, exposure may be performed so as to terminate the formation of the photoresist film PR2 at a position of 60 nm from the end portion of the polysilicon film PS1 toward the other end portion of the polysilicon film PS1. In this case, even when the overlapping precision with the end portion of the polysilicon film PS2 is ±30 nm, the termination position of the photoresist film PR2 can be prevented from protruding from a region right above the polysilicon film PS1.

As in the present embodiment, therefore, the control gate electrode CG is processed twice with two masks, one of the side walls of the control gate electrode CG is formed by first etching and the other side wall of the control gate electrode CG and the recess in the main surface of the semiconductor substrate SB are formed by second etching. As a result, the structure as shown in FIGS. 12 and 13 can be obtained stably.

Even when the size of the control gate electrode CG is decreased, the recess can be formed more stably in the main surface of the semiconductor substrate SB adjacent to the control gate electrode CG; and the main surface of the semiconductor substrate on the side of the drain region can be prevented from lowering by etching. This facilitates formation of the ONO film ON and the memory gate electrode MG at a low position so that the gate length of the memory gate electrode MG can be reduced while preventing an increase in off-leakage current due to reduction in the channel length. As a result, rewrite resistance and data retention characteristics can be improved. The semiconductor device thus manufactured can therefore have improved reliability.

An effect for improving rewrite resistance and data retention characteristics can be produced by carrying out hot electron injection from a substrate as a write system and carrying out hot hole injection from the substrate as an erase system. In other words, this effect can be obtained using SSI system injection in write operation and BTBT system injection in erase operation. This effect can also be obtained by carrying out hot electron injection from the substrate as a write system and hole injection from the memory gate electrode using FN system as an erase system.

In the present embodiment, extra injection for write/erase in such operations for the purpose of preventing a problem due to deviation between an injection position at the time of writing and an injection position at the time of erasing becomes unnecessary. In the memory cell of the MONOS memory, deterioration in the ONO film can be prevented and further, deterioration in rewrite resistance and data retention characteristics can be prevented.

Modification Example

Figure 14:
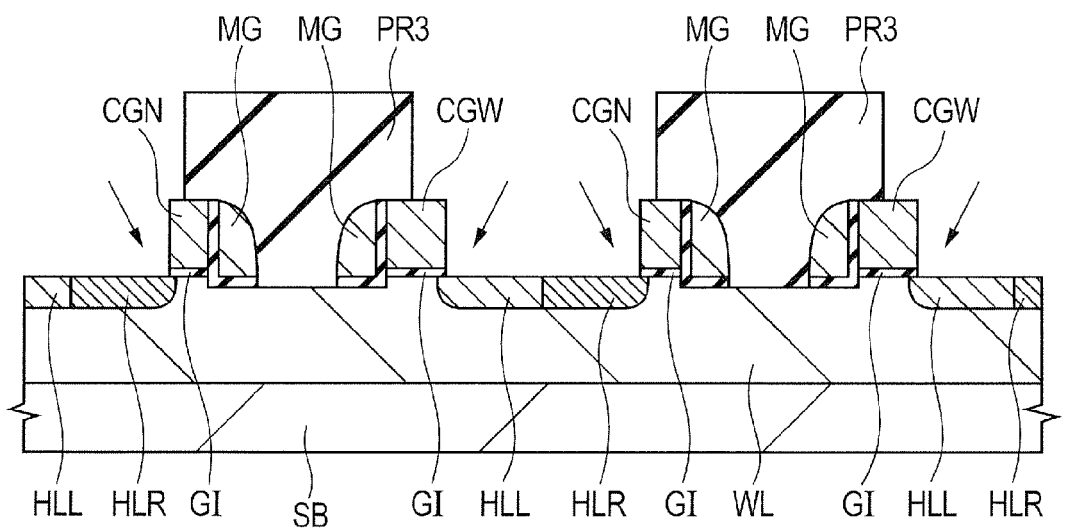
FIG. 14 is a cross-sectional view of a semiconductor device of a modification example of First Embodiment during a manufacturing step thereof.
Figure 15:
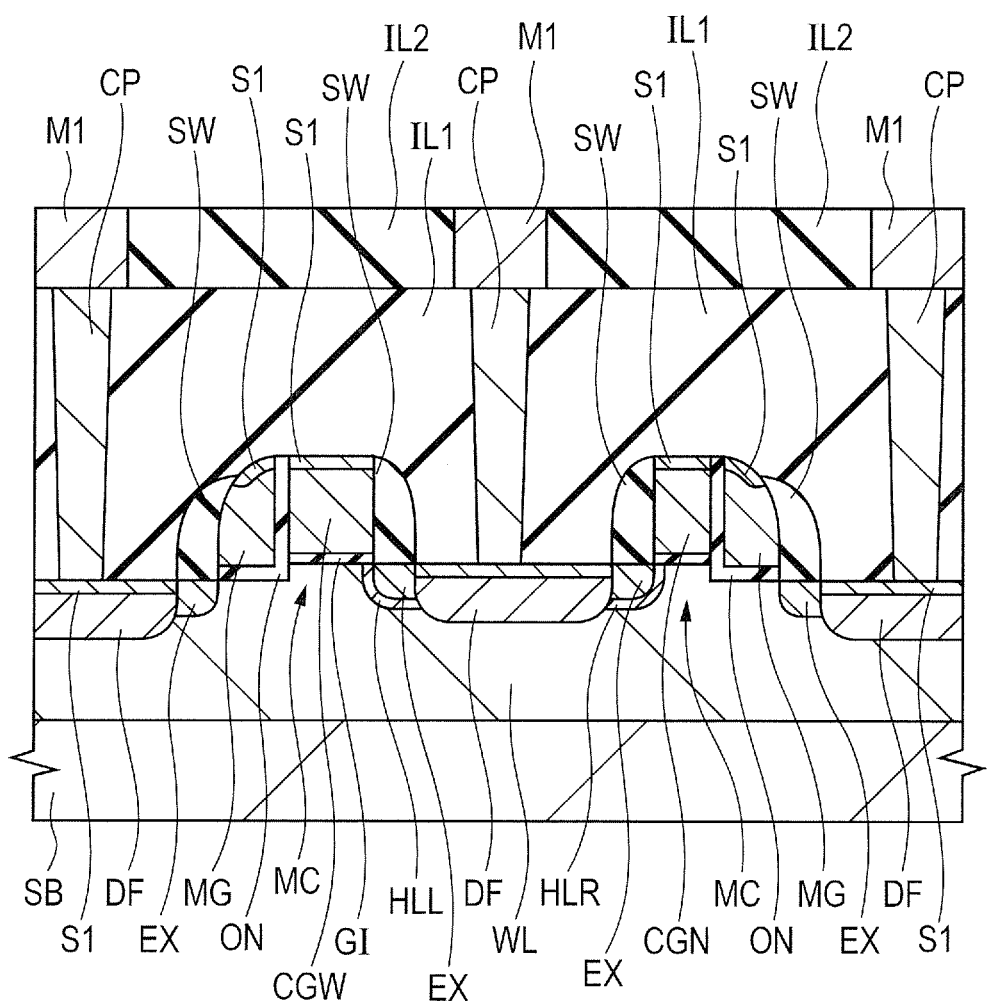
FIG. 15 is a cross-sectional view of the semiconductor device during a manufacturing step thereof following that of FIG. 14.
Figure 16:
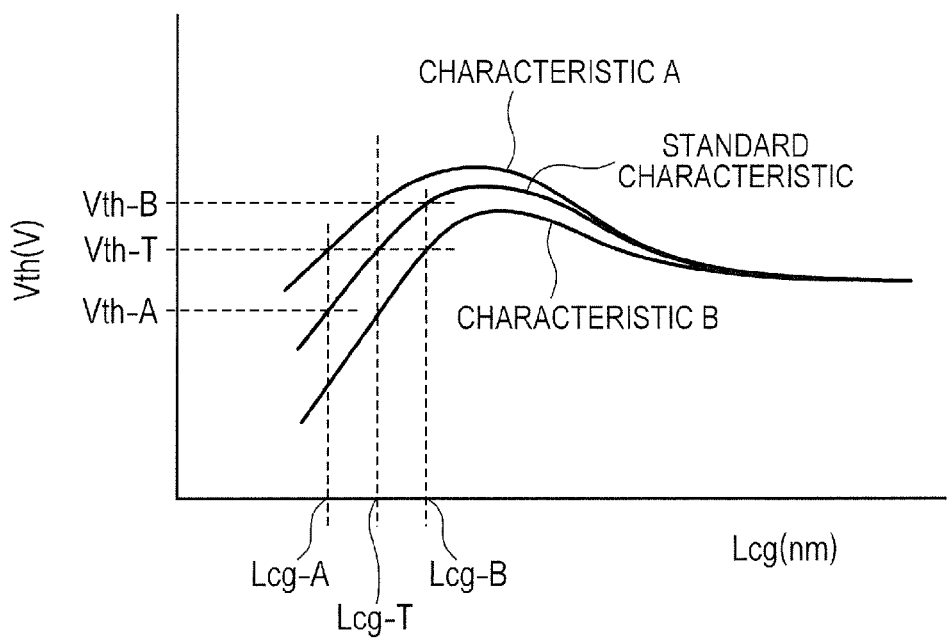
FIG. 16 is a graph showing the relationship of a control gate electrode between a gate length and a threshold voltage.

A modification example of the semiconductor device of the present embodiment will next be described referring to FIGS. 14 to 16. FIGS. 14 and 15 are cross-sectional views of the semiconductor device, which is a modification example of the present embodiment during manufacturing steps thereof. FIG. 16 is a graph showing the relationship between a gate length of the control gate electrode and a threshold voltage.

The present modification example describes on the prevention of variations in threshold voltage of a control transistor when the gate length of each of a plurality of control gate electrodes CG varies, by adjusting an impurity amount injected for halo region formation.

In the manufacturing steps of the present modification example, first, steps similar to those described referring to FIGS. 1 to 9 are performed. As shown in FIG. 14, a pattern of a photoresist film PR3 is then formed on a semiconductor substrate to cover the memory gate electrode MG and the recess in the main surface of the semiconductor substrate SB. Halo regions HLR and HLL are then formed by ion implantation using the photoresist film PR3 as a mask. The halo regions HLR and HLL are semiconductor regions formed in the main surface of the semiconductor substrate SB by implanting an impurity ion having a conductivity type different from that of source and drain regions of a control transistor and a memory transistor, which will be formed later, in order to adjust the threshold voltage of the control transistor and the memory transistor.

Here, the halo regions HLR and HLL are each formed using oblique ion implantation. The halo region HLR is a semiconductor region having an impurity concentration higher than that of the halo region HLL. The halo regions HLR and HLL are formed on the side of the drain of the control transistor which will be formed later and not on the side of the source region.

Next, as shown in FIG. 15, steps described referring to FIGS. 10 to 12 are performed to complete formation of a semiconductor device.

When the formation position of the photoresist film PR2 shown in FIG. 5 does not precisely overlap with the pattern of the polysilicon film PS1 processed in the etching step described referring to FIG. 3, the gate length of one of a pair of control gate electrodes CGW and CGN adjacent to each other in the first direction (gate length direction) may become smaller and the other one may become larger as shown in FIG. 14. This means that the control gate electrode CGN having a small gate length and the control gate electrode CGW having a large great length are juxtaposed alternately and repeatedly in the first direction. In this case, control transistors including such control gate electrodes CG, respectively, inevitably have difference in the characteristics. FIG. 14 shows, similar to FIG. 7, a cross-section including four control electrodes.

As shown in FIG. 14, the gate length of the control gate electrode CGN is smaller than that of the standard control gate electrode CG (refer to FIG. 12). This difference occurs due to deviation of the formation position of the photoresist film PR2. In addition, the gate length of the control gate electrode CGW is larger than that of the standard control gate electrode CG (refer to FIG. 12). This difference occurs due to deviation of the formation position of the photoresist film PR2. The gate length of the control gate electrode CGN with a small width will hereinafter be called "Lcg-A", the gate length of the control gate electrode CGW with a large width will hereinafter be called "Lcg-B", and the standard gate length of the control gate electrode CG will hereinafter be called "Lcg-T".

For example, when the standard gate length Lcg-T, that is, a target size is 60 nm and deviation of 5 nm occurs, the gate length Lcg-A becomes 55 nm and the gate length Lcg-B becomes 65 nm. In practice, as well as the overlapping misalignment of a photomask, various factors such as variations in the size of the photoresist film, variations in the wafer plane, and variations in the shot cause variations in the gate length. With regard to the overlapping misalignment, it has in-plane variations and also tends to have similar deviation within a wafer plane and a lot.

It is therefore possible to make the following judgment by, after etching of control gate electrodes of a certain lot, measuring the gate length of each of a pair of control gate electrodes of a plurality of chips in a plane of a certain wafer of the lot and averaging the measurement results. This means that it is possible to make judgment that one of the two adjacent control gate electrodes formed on each wafer of the lot has a gate length of, for example, about 55 nm and the other control gate electrode has a gate length of, for example, about 65 nm. When the variation is large between wafers, the gate length of two adjacent control gate electrodes of each wafer should be grasped.

Variations in the threshold voltage characteristic of a control transistor when the control gate electrode has a gate length different from a desired size (target size, standard size) as will be described above will be described referring to FIG. 16. FIG. 16 is a graph in which a gate length Lcg of a control gate electrode is plotted along the abscissa and a threshold voltage Vth of a control transistor is plotted along the ordinate. This includes a graph of a characteristic A, a graph of a standard characteristic, and a graph of a characteristic B in the descending order. The graph of a standard characteristic shows the characteristic of a threshold voltage Vth that varies according to the gate length Lcg of the control gate electrode when a halo injection amount is not adjusted according to variations in the size of the control gate electrode.

As shown in FIG. 16, the threshold voltage of a control transistor having a control gate electrode with a standard gate length Lcg-T is Vth-T according to the graph in the middle of three graphs shown in this drawing, that is, the standard characteristic graph. The threshold voltage of a control transistor having a control gate electrode with a gate length Lcg-A shorter than the standard gate length is Vth-A according to the graph of the standard characteristic. The threshold voltage of a control transistor having a control gate electrode with a gate length Lcg-B longer than the standard gate length is Vth-B according to the graph of the standard characteristic. Thus, a control transistor having a characteristic different from the target Vth-T is required to be adjusted so as to have a characteristic close to the target threshold voltage Vth-T, because there is a high possibility of such a transistor causing inconveniences in circuit operation.

As shown in FIG. 14, in manufacturing a control transistor including the control gate electrode CGN with a small gate length and a control transistor including the control gate electrode CGW with a large gate length, halo regions HLR and HLL are formed by halo implantation into the main surface of the semiconductor substrate SB on the side of the drain region in addition to the ion implantation for the formation of an $n^-$ type semiconductor region EX, which is an extension region. Halo implantation is performed to control a short channel effect by implantation of ions having a polarity different from that in the source and drain regions of a transistor. Halo implantation may be performed either before or after formation of the $n^-$ type semiconductor region EX. Here, as shown in FIG. 15, the halo regions HLR and HLL are formed so as to cover the periphery of the $n^-$ type semiconductor region EX except for the upper surface of the $n^-$ type semiconductor region EX.

The halo region HLR is formed by implanting a p type impurity (for example, B (boron)) into the main surface of the semiconductor substrate SB at a relatively high concentration, compared with the concentration for the formation of a halo region when a control gate electrode has a standard gate length Lcg-T, from an angle oblique to the main surface of the semiconductor substrate SB. The halo region HLR is formed so as to cover the $n^-$ type semiconductor region EX in the semiconductor substrate SB by using such an oblique ion implantation method. Ion implantation is performed from an angle oblique, for example, by from about 20 to 30 degrees relative to the angle of perpendicular implantation.

When the halo region HLR is formed, the concentration of a portion of the substrate having therein the halo region HLR becomes greater, compared with that when the halo region HRL is not formed. This makes it possible to suppress elongation of a depletion layer toward the channel side due to the $n^-$ type semiconductor region EX and thereby relax a short channel effect.

The halo region is also formed in order to relax a short channel effect when the control gate electrode has a standard gate length Lcg-T. When the gate length Lcg-A of the control gate electrode CGN is small as shown in FIG. 14, the dependence of a threshold voltage of a control transistor on gate length can be changed from the standard characteristic graph to the graph of the characteristic A as shown in FIG. 16 by increasing an ion implantation amount in halo implantation. As a result, the threshold voltage of the control transistor equipped with the control gate electrode CGN having a short gate length Lcg-A approximates the target threshold voltage Vth-T according to the characteristic A.

Compared with formation of a halo region when a control gate electrode has a standard gate length Lcg-T, the halo region HLL shown in FIG. 14 is formed by implanting a p type impurity (for example, B (boron)) into the main surface of the semiconductor substrate SB at a relatively low concentration from an angle oblique to the main surface of the semiconductor substrate SB.

When the halo region HLL is formed, the concentration of a portion of the substrate having therein the halo region HLL becomes smaller compared with that when the halo region HLL is not formed. This makes it possible to enhance elongation of a depletion layer to the channel side due to the $n^-$ type semiconductor region EX and thereby accelerate a short channel effect.

The halo region is also formed for relaxing a short channel effect when the control gate electrode has a standard gate length Lcg-T. When the gate length Lcg-B of the control gate electrode CGW is large, the dependence of the threshold voltage of the control transistor on the gate length can be changed from the standard characteristic graph to the graph of the characteristic B as shown in FIG. 16 by decreasing the ion implantation amount in halo implantation. The threshold voltage of a control transistor equipped with the control gate electrode CGW with a long gate length Lcg-B approximates the target threshold voltage Vth-T according to the characteristic B.

The cross-section shown in FIG. 14 clearly shows the boundary between the halo region HLR and the halo region HLL at the center between the two adjacent control gate electrodes CGN and CGW. The boundary however actually becomes vague because in forming the halo regions HLR and HLL by oblique ion implantation, both an impurity ion to be implanted for forming the halo region HLR and an impurity ion to be implanted for forming the halo region HLL are implanted into a portion not shaded by the control gate electrodes CGN and CGW and the photoresist film PR3.

Only the halo region HLR right below the control gate electrode CGN and the halo region HLL right below the control gate electrode CGW are actually useful for the adjustment of the threshold voltage. The halo region HLR right below the control gate electrode CGN and the halo region HLL right below the control gate electrode GCW have respectively different boron (B) concentrations.

As described above, variations in gate length of a control gate electrode may occur due to photomask misalignment when the control gate electrodes are formed by performing etching twice. Even in such a case, the threshold voltage of a control transistor having the control gate electrode CGN can be made closer to the desired value by increasing the concentration of the halo region HLR formed in the main surface of the semiconductor substrate SB on the side of the drain of the control gate electrode CGN having a gate length smaller than the standard one.

By decreasing the concentration of the halo region HLL to be formed in the main surface of the semiconductor substrate SB on the side of the drain region of the control gate electrode CGW having a gate length longer than the normal one, the threshold voltage of the control transistor having the control gate electrode CGW can be approximated to a desired value. This makes it possible to prevent the characteristics of the memory cell from varying due to variations in the gate length of the control gate electrode and thereby stabilize the circuit operation. The semiconductor device thus obtained can therefore have improved reliability.

Second Embodiment

Figure 17:
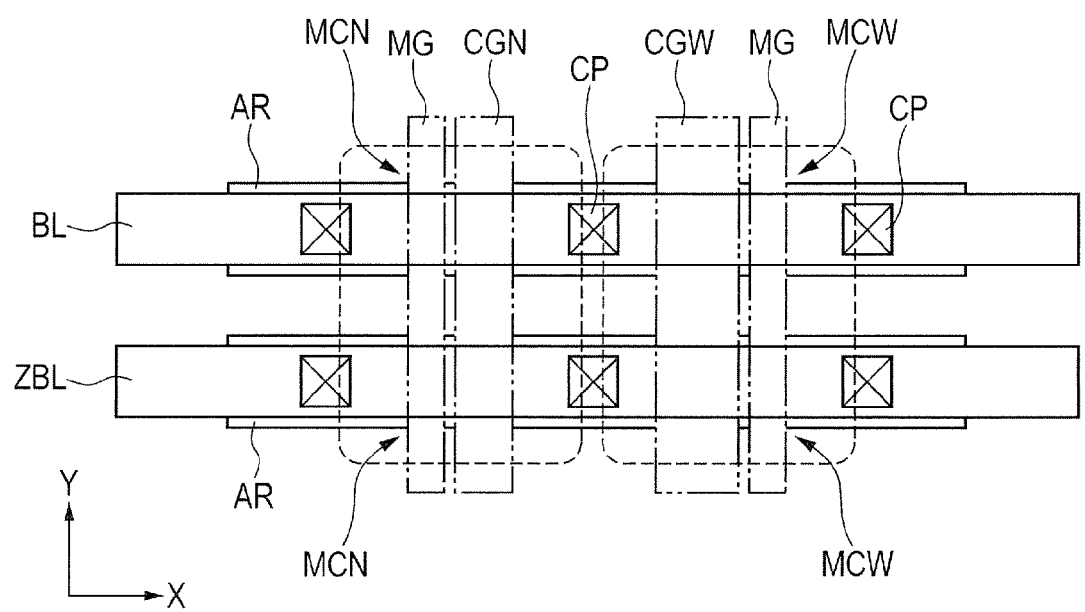
FIG. 17 is a planar layout of a semiconductor device of Second Embodiment.

FIG. 17 describes the present embodiment in which when variations occur in the gate length of a control gate electrode, a circuit operation can be prevented from becoming unstable due to a difference in the characteristics of a pair of memory cells which a complementary memory cell has. FIG. 17 is a planar layout of a semiconductor device of the present embodiment.

A complementary memory cell is sometimes used because a module including a memory requiring a plurality of times of rewriting is likely to deteriorate. This means that in a data memory, rewrite is performed very frequently (for example, about 250000 times) so that there may occur deterioration in write characteristic or erase characteristic or variations in threshold voltage during data retention. Such a problem can be overcome by using a complementary memory configuration. In addition to the data memory, there is a code memory in which rewrite is performed less frequently than the data memory (for example, about 1000 times).

The complementary memory is a memory for storing data having a complementary relationship in two memory cells, respectively, for storing one data. When a data "1" is stored in a first memory cell, a data "0" is stored in a second memory cell. On the other hand, when a data "0" is stored in the first memory cell, a data "1" is stored in the second memory cell.

One of these complementary data is read out through a bit line BL and the other data is read out through a bit line ZBL. The complementary memory is a memory having sensitivity enhanced by operating a sense amplifier while comparing data read out through the bit lines BL and ABL, respectively. The electric current flowing through the bit lines BL and ZBL differ, respectively, depending on a difference between the threshold voltage of a transistor configuring the first memory cell and the threshold voltage of a transistor configuring the second memory cell. Two memory cells are necessary for storing one data so that the module has a larger area, but a memory loading amount of a data memory is smaller than that of a code memory so that even using a complementary memory does not increase a module area so much in an entirety of a chip.

FIG. 17 shows two memory cells MCN and two memory cells MCW for data. FIG. 17 shows the profile of the control gate electrodes CGN and CGW and the memory gate electrode MG by a dotted line in a region where they overlap with bit lines BL and ZBL formed on the memory cells MCN and MCW, respectively, in plan view. It is also a perspective view showing contact plugs CP formed below the bit lines BL and ZBL, respectively and coupled to the source and drain regions of the memory cells MCN and MCW.

As described in the modification example of First Embodiment, the control gate electrodes of the present invention are formed by etching twice through two masks (photomasks). Due to misalignment between these two masks, the gate length of one of a pair of control gate electrodes arranged in the first direction (gate length direction) may become smaller than the standard gate length and the gate length of the other control gate electrode may become larger than the standard gate length. The planar layout shown in FIG. 17 shows a memory cell MCW having a control gate electrode CGW with a large gate length and a memory cell MCN having a control gate electrode CGN with a gate length smaller than that of the control gate electrode CGW.

The memory cell MCW and the memory cell MCN are arranged adjacent to each other in the X-axis direction (first direction, gate length direction). The two memory cells MCW having one control gate electrode CGW in common are arranged adjacent to each other in the Y-axis direction (second direction, gate width direction). The two memory cells MCN having one control gate electrode CGN in common are arranged adjacent to each other in the Y-axis direction (second direction, gate width direction). The memory cells MCN adjacent to each other in the Y-axis direction have one control gate electrode CGN and one memory gate electrode MG in common. Similarly, the memory cells MCW adjacent to each other in the Y-axis direction have one control gate electrode CGW and one memory gate electrode MG in common.

The control gate electrodes CGW and CGN adjacent to each other in the X-axis direction are in the same active region AR and the drain region which the control gate electrodes CGW and CGN have in common is coupled to either one of the bit lines BL and ZBL via the contact plug CP. This means that the drain region of one of the memory cells MCN adjacent to each other in the Y-axis direction is coupled to the bit line BL and the drain region of the other memory cell MCN is coupled to the bit line ZBL. Similarly, the drain region of one of the memory cells MCW adjacent to each other in the Y-axis direction is coupled to the bit line BL and the drain region of the other memory cell MCW is coupled to the bit line ZBL.

In FIG. 17, a pair of two memory cells is surrounded with a dotted line when a complementary data memory is used. FIG. 17 shows two pairs of memory cells of a complementary memory. This planar layout shows, as a complementary memory, a pair of memory cells adjacent to each other in the Y-axis direction. The memory cells are not necessarily adjacent to each other and memory cells having one control gate electrode in common may be used as a pair. Thus, the present embodiment is characterized in that a complementary memory is comprised of a pair of memory cells having one control gate electrode equal in gate length in common.

In the complementary memory comprised of memory cells having one control gate electrode in common, the gate length of the control gate electrode is the same between these memory cells. Even when there appears a difference in gate length between the control gate electrodes arranged in the X-axis direction, appearance of a difference in the characteristics between these two memory cells configuring the complementary memory due to the difference in gate length can be prevented. The complementary memory can therefore be prevented from malfunction upon its use and the stability of a circuit operation can be enhanced. This means that the resulting semiconductor device can have improved reliability.

Third Embodiment

In the present embodiment, a structure for preventing occurrence of a characteristic difference between memory cells of a code memory will be described referring to FIGS. 18 to 22. It is achieved by forming a recess in the main surface of a semiconductor substrate right below a memory gate electrode in a data memory cell, while a recess is not formed in the main surface of the semiconductor substrate right below the memory gate electrode in a code memory cell. FIGS. 18 to 22 are cross-sectional views of a semiconductor device of the present embodiment during manufacturing steps thereof. FIGS. 18 to 22 show a data memory region 1A on their left side and a code memory region 2A on their right side.

A nonvolatile memory sometimes has two modules, that is, a data memory (for example, a memory for recording varying data) requiring a plurality of times of rewriting and a code memory (for example, a memory for recording program code) not requiring a plurality of times of rewriting. In the semiconductor device of the present embodiment, a recess is formed by digging the upper surface of the substrate on the side of a source region by applying the manufacturing method described in First Embodiment to the formation of the data memory requiring a plurality of times of rewriting, while the code memory not requiring a plurality of times of rewriting is obtained by forming a control gate electrode by etching once and not digging the substrate in the vicinity of the control gate electrode.

As described above referring to FIGS. 23 and 24, when a substrate on the side of the source region in the code memory region 2A is not dug, a memory gate electrode having an appropriate gate length (channel length) not to cause punch-through should be formed. When an FN electron injection erase system is used, the memory gate electrode of the data memory and that of the code memory may have the same gate length.

Figure 18:
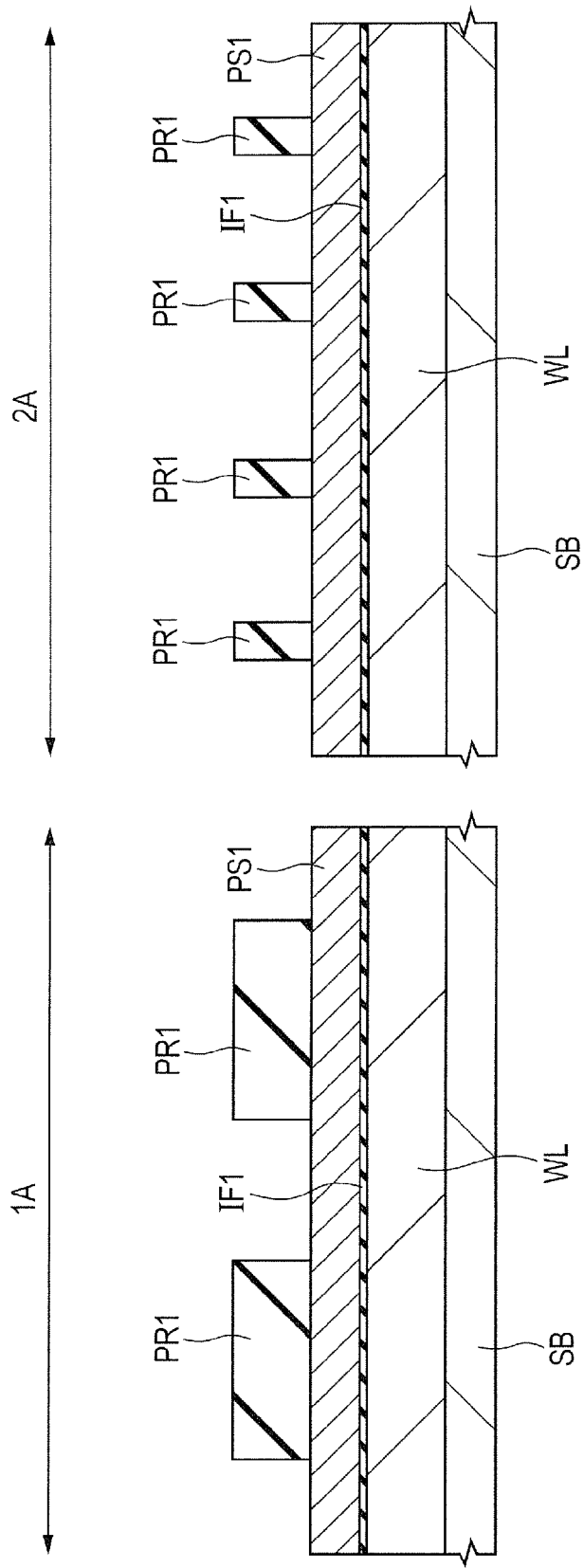
FIG. 18 is a cross-sectional view of a semiconductor device of Third Embodiment during a manufacturing step thereof.

In the manufacturing steps of the present embodiment, after steps similar to those described referring to FIG. 1, a resist pattern of a photoresist film PR1 is formed on the polysilicon film PS1 as shown in FIG. 18 by a step similar to that described referring to FIG. 2. In the data memory region LA, a photoresist film PR1 similar to the photoresist film PR1 shown in FIG. 2 is formed. In the code memory region 2A, on the other hand, a plurality of photoresist films PR1 each made of a pattern narrower than that formed in the data memory region 1A are formed.

The width of the photoresist film PR1 formed in the code memory region 2A corresponds to the gate length of a control gate electrode CG to be formed later in the code memory region 2A. This means that in the data memory region LA, the photoresist film PR1 covers the formation region of the source region of a control transistor and a memory transistor, each to be formed later, and exposes the formation region of the drain region thereof. In the code memory region 2A, on the other hand, both the formation regions of the source and drain regions of a control transistor and a memory transistor to be formed later are exposed.

Figure 19:
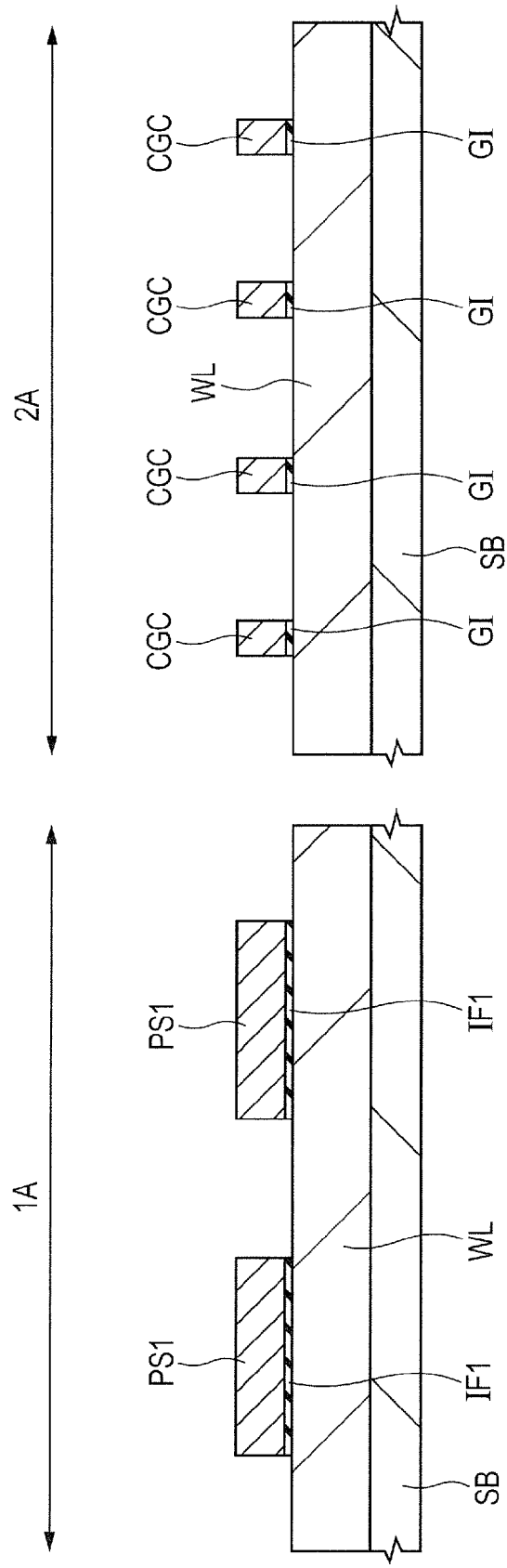
FIG. 19 is a cross-sectional view of the semiconductor device during a manufacturing step thereof following that of FIG. 18.

Next, as shown in FIG. 19, a step similar to that described referring to FIGS. 3 and 4 is performed. By this step, in the data memory region 1A, the polysilicon film PS1 and the insulating film IF1 are processed as in FIG. 3.

In the code memory region 2A, the polysilicon film PS1 and the insulating film IF1 are processed by dry etching (first etching) with the photoresist film PR1 as a mask. As a result, a control gate electrode CGC made of the polysilicon film PS1 and a gate insulating film GI made of the insulating film IF1 are formed. Since the main surface of the semiconductor substrate SB is not dug by the dry etching, the main surface level of the semiconductor substrate SB is almost uniform in a region right below the control gate electrode CGC and in a region on the side of the control gate electrode CGC.

Figure 20:
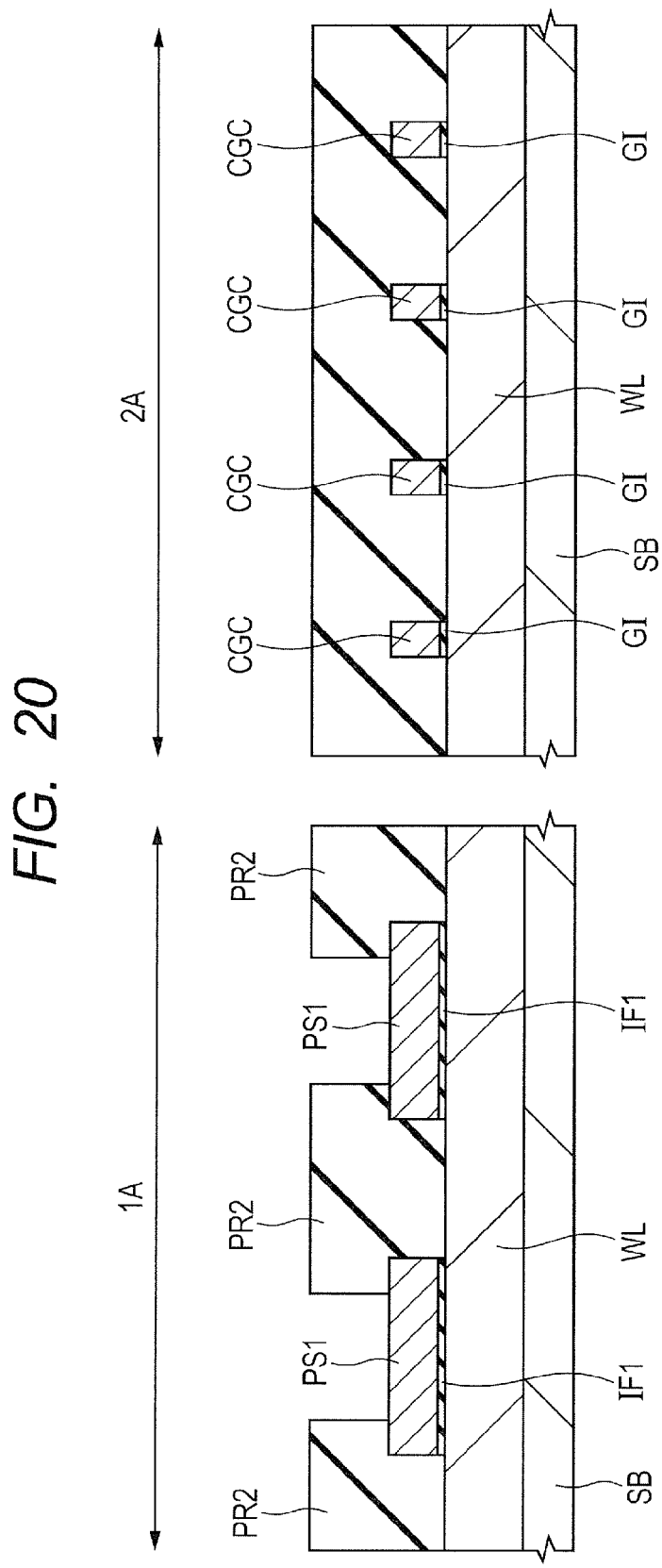
FIG. 20 is a cross-sectional view of the semiconductor device during a manufacturing step thereof following that of FIG. 19.

Next, as shown in FIG. 20, a step similar to that described referring to FIG. 5 is performed to form a photoresist film PR2. The pattern shape of the photoresist film PR2 formed in the data memory region 1A is the same as that of the photoresist film PR2 shown in FIG. 5. In the code memory region 2A, the photoresist film PR2 covers therewith the stacked film comprised of the gate insulating film GI and the control gate electrode CGC and the main surface of the semiconductor substrate SB. This means that the entirety of the code memory region 2A is covered with the photoresist film PR2.

Figure 21:
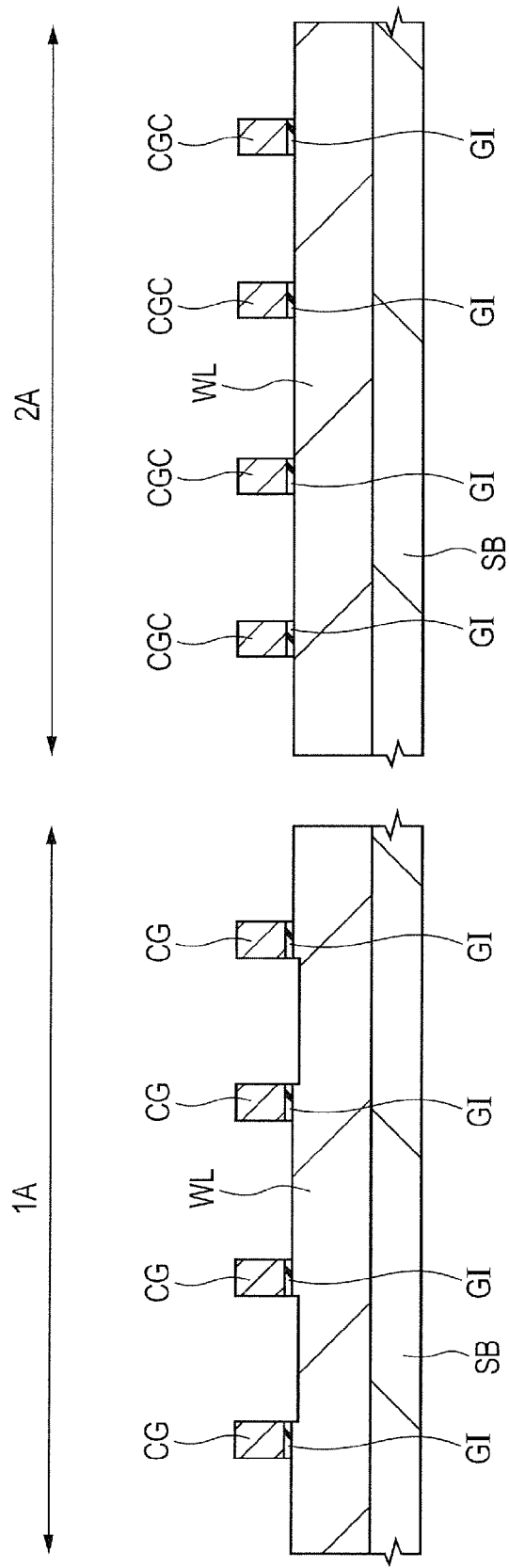
FIG. 21 is a cross-sectional view of the semiconductor device during a manufacturing step thereof following that of FIG. 20.

Next, as shown in FIG. 21, steps similar to those described referring to FIGS. 6 and 7 are performed. This means that second etching is performed. By this etching, a gate insulating film GI and a control gate electrode CG are formed in the data memory region 1A and at the same time, a portion of the main surface of the semiconductor substrate in the data memory region 1A is lowered to form a recess. When the second etching is performed, the code memory region 2A is protected with the photoresist film PR2 so that the control gate electrode CGC and the main surface of the semiconductor substrate SB around the control gate electrode CGC are not exposed to etching.

The semiconductor substrate SB therefore has, in the main surface thereof, a recess in one of two regions on the sides of the control gate electrode CG in the data memory region 1A but no recess in both sides of the control gate electrode CGC in the code memory region 2A.

Figure 22:
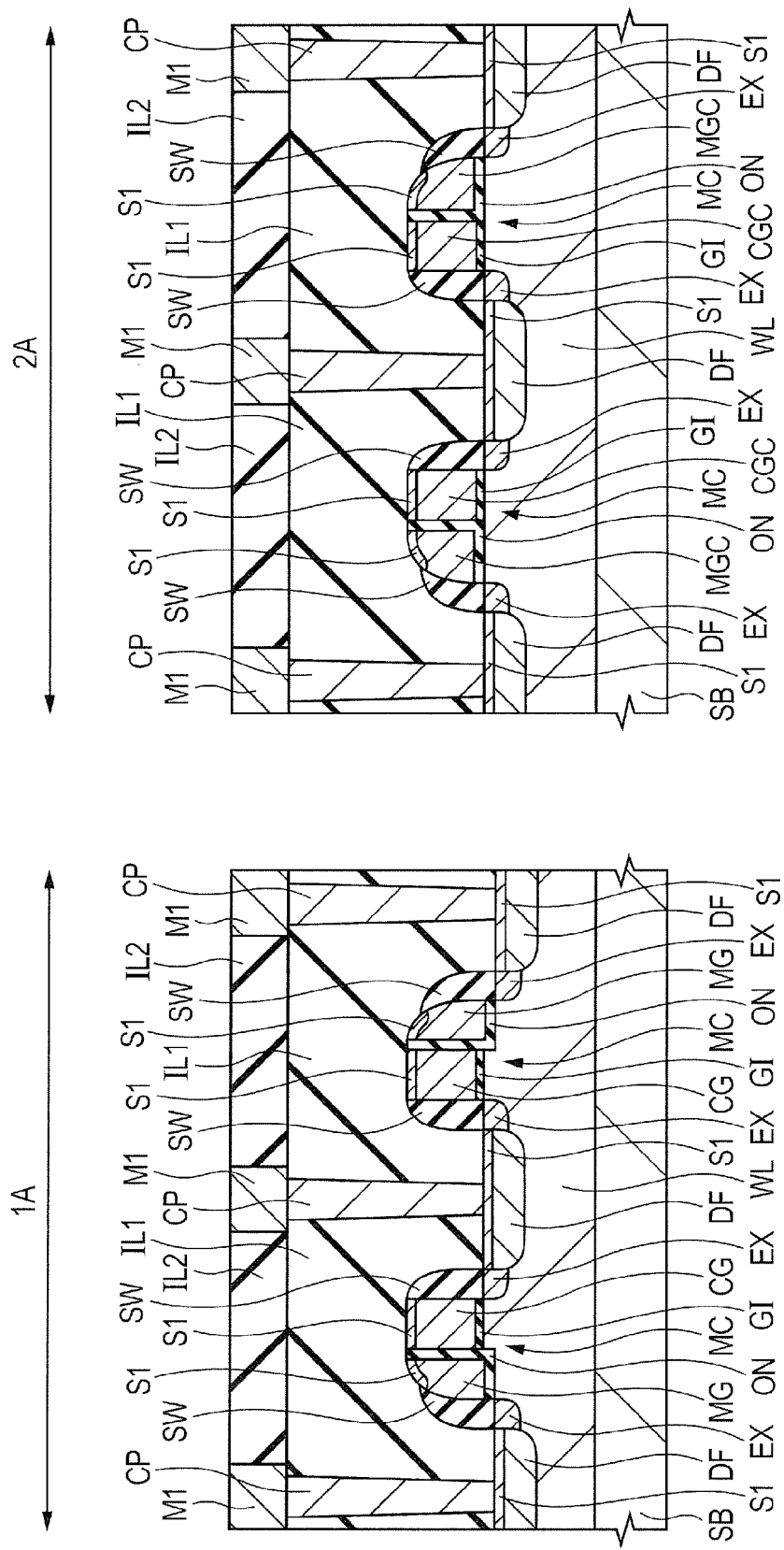
FIG. 22 is a cross-sectional view of the semiconductor device during a manufacturing step thereof following that of FIG. 21.

Next, as shown in FIG. 22, steps similar to those described referring to FIGS. 8 to 12 are performed to complete formation of the semiconductor device of the present embodiment. This means that a memory cell MC having a structure similar to that shown in FIG. 12 is formed in the data memory region 1A. In the code memory region 2A, a memory cell MC is also formed, which includes the control gate electrode CGC and the memory gate electrode MG, but the stacked film configuring the memory cell MC and comprised of the memory gate electrode MGC and the ONO film ON has a height equal to that of the control gate electrode CGC.

The semiconductor substrate SB has no recess in the main surface thereof right below the memory gate electrode MGC and the ONO film ON adjacent to the control gate electrode CGC, while the semiconductor substrate SB has almost a flat main surface in the active region of the code memory region 2A. The bottom surface of the ONO film ON in the data memory region 1A is positioned in a lower region than the bottom surface of the ONO film ON in the code memory region 2A. FIG. 22 shows, different from FIGS. 18 to 21, a cross-section of only a region including a pair of control gate electrodes in each of the data memory region 1A and the code memory region 2A.

Thus, in the present embodiment, in the memory cell MC of the data memory, the control gate electrode CG is formed using two masks as in First Embodiment and the height of the upper surface of the semiconductor substrate SB right below the memory gate electrode MG is lowered. In the memory cell MC of the code memory, on the other hand, a pattern of the control gate electrode CG is formed (defined) using only one mask and the main surface of the semiconductor substrate SB right below the memory gate electrode MGC is not lowered. The memory gate electrode MGC formed in the code memory region 2A has a gate length greater than that of the memory gate electrode MG formed in the data memory region 1A. In this case, the memory gate electrodes MG and MGC are formed in respective steps in the data memory region 1A and the code memory region 2A.

An advantage similar to that obtained in First Embodiment can be obtained in the present embodiment by forming a recess in a portion of the main surface of the semiconductor substrate SB and lowering the formation positions of the ONO film ON and the memory gate electrode MG adjacent to the control gate electrode CG. As described above using the comparative examples shown in FIGS. 23 and 24, extra holes should be injected for erase operation if there is a difference in the carrier injection position between write and erase operations. This may however cause problems such as deterioration in write/erase characteristics and deterioration in data retention characteristics in the memory cells that perform a plurality of times of rewriting. In the present embodiment, in the data memory requiring a plurality of times of rewriting, write injection position and erase injection position in the ONO film are made closer so that the above-described deterioration can be prevented.

As described above in the modification example of First Embodiment, when control gate electrodes are formed by twice etching, a difference appears in the size between two adjacent control gate electrodes, leading to a difference in characteristics between the memory cells including these control gate electrodes, respectively. When a memory cell structure similar to that of First Embodiment is used for the code memory, the code memory also has a similar problem.

A memory, such as the code memory shown in FIG. 22, that performs a rewrite operation more infrequently than the data memory rarely has deteriorated write/erase characteristics or data retention characteristics even when extra holes are injected into the ONO film ON for erase operation. Shortening the gate length (channel length) of the memory gate electrode MGC to make the carrier injection position in write operation and that in erase operation close to each other therefore produces only a small advantage. It is therefore almost unnecessary to lower the upper surface level of the semiconductor substrate SB right below the memory gate electrode MGC to shorten the gate length of the memory transistor. On the other hand, formation of the control gate electrodes by performing etching twice in the manufacturing step of the code memory produces a difference in size among the control gate electrodes and causes variations in the characteristics of the resulting memory cell.

In the present embodiment, the memory cell MC similar to that of First Embodiment is formed in the data memory region 1A, while the control gate electrode CGC is formed by performing etching once in the code memory region 2A. Thus, the memory gate electrode MGC is formed without lowering the upper surface level of the semiconductor substrate SB. It is therefore possible to prevent variations in the characteristic of the memory cells in the code memory, which will otherwise occur due to size difference in the control gate electrodes CGC, even when overlapping misalignment occurs in the formation step of the control gate electrodes CG of the data memory.

Even when a pair of control gate electrodes in the data memory differs in size, problems due to it can be overcome or alleviated by the configuration described in the modification example of First Embodiment or Second Embodiment. In addition, an influence of a difference in gate length between a pair of control gate electrodes on the characteristic difference can be relatively reduced by preliminarily setting a larger gate length for the control gate electrodes thus formed. As described above, a loading amount of the data memory in a semiconductor chip is small so that even an increase in the gate length of the control gate electrode has less influence on an increase in the area of the chip.

When in the data memory region 1A shown in FIG. 22, a plurality of control gate electrodes differs in size as in the modification example of First Embodiment described referring to FIG. 14, the control gate electrode CGN (refer to FIG. 14) having a relatively small gate length and the control gate electrode CGW (refer to FIG. 14) having a relatively large gate length are alternately and repeatedly juxtaposed in the first direction. In this case, the gate length of the control gate electrode CGC formed in the code memory region 2A is larger than that of the control gate electrode CGN and smaller than that of the control gate electrode CGW.

The invention made by the present inventors has been described specifically based on some embodiments. It is needless to say that the invention is not limited to or by these embodiments but can be modified variously without departing from the gist of the invention.

Any two or more of First Embodiment, the modification example of First Embodiment, Second embodiment, and Third Embodiment may be used in combination. When as shown in FIG. 14, the halo injection amount is changed according to the gate length of the control gate electrode in the data memory and a code memory is formed as in Third Embodiment, halo injection may be performed in the code memory under conditions (for example, injection concentration and injection angle) different from the halo injection conditions in the data memory.

What is claimed is:
1. A method of manufacturing a semiconductor device, comprising:
(a) providing a semiconductor substrate having a first region, a second region, a third region, a fourth region, a fifth region, and a sixth region adjacently arranged along a main surface of the semiconductor substrate in the order of mention;

(b) forming a first insulating film and a first conductor film successively over the main surface of the semiconductor substrate;

(c) removing the first conductor film in the first and sixth regions;

(d) removing the first conductor film, the first insulating film, and a portion of an upper surface of the semiconductor substrate in the third and fourth regions, to form a recess in the upper surface of the semiconductor substrate;

(e) after (c) and (d), successively forming a second insulating film having therein a charge retention portion and a memory gate electrode over a bottom surface of the recess in each of the third and fourth regions;

(f) forming a pair of a first source region having a first conductivity type and a first drain region having the first conductivity type in the upper surface of the semiconductor substrate so as to sandwich therebetween the second region and the third region in an arrangement direction of the second region and the third region, and forming a pair of a second source region having the first conductivity type and a second drain region having the first conductivity type in the upper surface of the semiconductor substrate so as to sandwich therebetween the fourth region and the fifth region in an arrangement direction of the fourth region and fifth region; and (g) after (e), forming a first semiconductor region having a second conductivity type different from the first conductivity type in the main surface of the semiconductor substrate in the first region and forming a second semiconductor region having the second conductivity type in the main surface of the semiconductor substrate in the sixth region, wherein after (c) and (d), the first conductor film remaining in the second region configures a first control gate electrode and the first conductor film remaining in the fifth region configures a second control gate electrode, wherein the first control gate electrode, the memory gate electrode adjacent to a side wall of the first control gate electrode via the second insulating film, the first source region, and the first drain region configure a first memory cell of a nonvolatile memory, wherein the second control gate electrode, the memory gate electrode in the fourth region, the second source region, and the second drain region configure a second memory cell of the nonvolatile memory, wherein the first control gate electrode has a gate length greater than a gate length of the second control gate electrode, and wherein the first semiconductor region has an impurity concentration lower than an impurity concentration of the second semiconductor region.

2. The method of manufacturing a semiconductor device according to claim 1,
wherein the first memory cell writes or erases data by injecting electrons or holes from a side of the semiconductor substrate into the second insulating film, respectively.

3. The method of manufacturing a semiconductor device according to claim 1,
wherein the first memory cell writes data by injecting electrons from a side of the semiconductor substrate into the second insulating film and erases data by injecting holes from the memory gate electrode into the second insulating film.

4. The method of manufacturing a semiconductor device according to claim 1,
wherein the semiconductor substrate further has, on the main surface thereof, a seventh region and an eighth region adjacently arranged to each other,
wherein in (c), the first conductor film on both sides of the seventh region is also removed and a third control gate electrode having the first conductor film remaining in the seventh region is formed,
wherein in (e), the second insulating film and the memory gate electrode are also successively formed over the main surface of the semiconductor substrate in the eighth region,
wherein in (f), a pair of a third source region having the first conductivity type and a third drain region having the first conductivity type are also formed in the main surface of the semiconductor substrate so as to sandwich therebetween the seventh region, and
wherein the third control gate electrode, the memory gate electrode adjacent to a side wall of the third control gate electrode via the second insulating film, the third source region, and the third drain region configure a third memory cell of the nonvolatile memory.

5. The method of manufacturing a semiconductor device according to claim 4,
wherein the first and second memory cells configure a data memory, while the third memory cell configures a code memory.

6. The method of manufacturing a semiconductor device according to claim 1,
wherein the bottom surface of the recess is present below an interface between the main surface of the semiconductor substrate and the first insulating film.

7. The method of manufacturing a semiconductor device according to claim 1,
wherein the first drain region is formed in the main surface of the semiconductor substrate on the side of the first region adjacent to the second region, and the first source region is formed over the bottom surface of the recess on the side of the third region adjacent to the second region.

8. The method of manufacturing a semiconductor device according to claim 1,
wherein the first control gate electrodes of a pair of memory cells formed adjacent to each other in a first direction along the main surface of the semiconductor substrate have respectively different gate lengths,
wherein plural first memory cells are arranged in a second direction orthogonal to the first direction, and
wherein two of the first memory cells arranged in the second direction and having one of the first control gate electrodes in common configure a complementary memory.

9. The method of manufacturing a semiconductor device according to claim 1,
wherein in (c), the first conductor film is removed to form an alignment mark, and
wherein in (d), a position at which the first conductor film, the first insulating film, and the portion of the upper surface of the semiconductor substrate are removed is determined with the alignment mark as a guide.

10. The method of manufacturing a semiconductor device according to claim 1,
wherein (c) is followed by (d).

11. A method of manufacturing a semiconductor device, comprising:

(a) providing a semiconductor substrate having, on a main surface thereof, a first region, a second region, a third region, a fourth region, a fifth region, and a sixth region adjacently arranged in order of mention, and a seventh region and an eighth region adjacently arranged to each other;

(b) forming a first insulating film and a first conductor film successively over the main surface of the semiconductor substrate;

(c) removing the first conductor film in the first and sixth regions, removing the first conductor film on both sides of the seventh region, and forming a third control gate electrode having the first conductor film remaining in the seventh region;

(d) removing the first conductor film, the first insulating film, and a portion of an upper surface of the semiconductor substrate in the third and fourth regions, to form a recess in the upper surface of the semiconductor substrate;

(e) after (c) and (d), successively forming a second insulating film having therein a charge retention portion and a memory gate electrode over a bottom surface of the recess of the semiconductor substrate in each of the third and fourth regions and over the main surface of the semiconductor substrate in the eighth region; and (f) forming:
  a pair of a first source region having a first conductivity type and a first drain region having the first conductivity type in the upper surface of the semiconductor substrate so as to sandwich therebetween the second region and the third region in an arrangement direction of the second region and the third region;
  a pair of a second source region having the first conductivity type and a second drain region having the first conductivity type in the upper surface of the semiconductor substrate so as to sandwich therebetween the fourth region and the fifth region in an arrangement direction of the fourth region and the fifth region; and
  a pair of a third source region having the first conductivity type and a third drain region having the first conductivity type in the main surface of the semiconductor substrate so as to sandwich therebetween the seventh region, wherein after (c) and (d), the first conductor film remaining in the second region configures a first control gate electrode and the first conductor film remaining in the fifth region configures a second control gate electrode, wherein the first control gate electrode, the memory gate electrode adjacent to a side wall of the first control gate electrode via the second insulating film, the first source region, and the first drain region configure a first memory cell of a nonvolatile memory, wherein the second control gate electrode, the memory gate electrode adjacent to a side wall of the second control gate electrode via the second insulating film, the second source region, and the second drain region configure a second memory cell of the nonvolatile memory, wherein the third control gate electrode, the memory gate electrode adjacent to a side wall of the third control gate electrode via the second insulating film, the third source region, and the third drain region configure a third memory cell of the nonvolatile memory, and wherein the third control gate electrode has a gate length greater than a gate length of the first control gate electrode and smaller than a gate length of the second control gate electrode.

12. The method of manufacturing a semiconductor device according to claim 11,
wherein the first memory cell writes or erases data by injecting electrons or holes from a side of the semiconductor substrate into the second insulating film, respectively.

13. The method of manufacturing a semiconductor device according to claim 11,
wherein the first memory cell writes data by injecting electrons from a side of the semiconductor substrate into the second insulating film and erases data by injecting holes from the memory gate electrode into the second insulating film.

14. The method of manufacturing a semiconductor device according to claim 11, further comprising:
  (g) after (e), forming a first semiconductor region having a second conductivity type different from the first conductivity type in the main surface of the semiconductor substrate in the first region and forming a second semiconductor region having the second conductivity type in the main surface of the semiconductor substrate in the sixth region,
  wherein the first control gate electrode has a gate length greater than a gate length of the second control gate electrode, and
  wherein the first semiconductor region has an impurity concentration lower than an impurity concentration of the second semiconductor region.

15. The method of manufacturing a semiconductor device according to claim 11,
wherein the bottom surface of the recess is present below an interface between the main surface of the semiconductor substrate and the first insulating film.

16. The method of manufacturing a semiconductor device according to claim 11,
wherein the first drain region is formed in the main surface of the semiconductor substrate on a side of the first region adjacent to the second region and the first source region is formed over the bottom surface of the recess on a side of the third region adjacent to the second region.

17. The method of manufacturing a semiconductor device according to claim 11,
wherein the first control gate electrodes of a pair of memory cells formed adjacent to each other in a first direction along the main surface of the semiconductor substrate have respectively different gate lengths,
wherein plural first memory cells are arranged in a second direction orthogonal to the first direction, and
wherein two of the first memory cells arranged in the second direction and having one of the first control gate electrodes in common configure a complementary memory.

18. The method of manufacturing a semiconductor device according to claim 11,
wherein in (c), the first conductor film is removed to form an alignment mark, and
wherein in (d), a position at which the first conductor film, the first insulating film, and the portion of the upper surface of the semiconductor substrate are removed is determined with the alignment mark as a guide.

19. The method of manufacturing a semiconductor device according to claim 11, wherein (c) is followed by (d).

* * * * *